US010325970B2

(12) United States Patent
Bang et al.

(10) Patent No.: US 10,325,970 B2
(45) Date of Patent: Jun. 18, 2019

(54) DISPLAY DEVICE

(71) Applicant: Samsung Display Co., Ltd., Yongin-si (KR)

(72) Inventors: Hyunsung Bang, Yongin-si (KR); Arong Kim, Yongin-si (KR); Jungsun Park, Yongin-si (KR); Duckjung Lee, Yongin-si (KR); Jiyoung Choung, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/838,091

(22) Filed: Dec. 11, 2017

(65) Prior Publication Data

US 2018/0366524 A1  Dec. 20, 2018

(30) Foreign Application Priority Data

Jun. 19, 2017 (KR) ........................ 10-2017-0077584

(51) Int. Cl.
*H01L 27/32* (2006.01)
*H01L 51/52* (2006.01)
(Continued)

(52) U.S. Cl.
CPC ...... *H01L 27/3246* (2013.01); *H01L 51/0011* (2013.01); *H01L 51/0021* (2013.01);
(Continued)

(58) Field of Classification Search
CPC ............. H01L 51/5012; H01L 51/5218; H01L 51/5228; H01L 51/5234; H01L 2251/558; H01L 2251/305; H01L 2251/5315

See application file for complete search history.

(56) References Cited

U.S. PATENT DOCUMENTS 5,953,585 A   9/1999  Miyaguchi
6,013,538 A   1/2000  Burrows et al.
(Continued)

FOREIGN PATENT DOCUMENTS

EP   0734078   9/1996
EP   0774787   5/1997
(Continued)

OTHER PUBLICATIONS

US 9,006,019 B2, 04/2015, Otsuka et al. (withdrawn)

*Primary Examiner* — Brian Turner
(74) *Attorney, Agent, or Firm* — H.C. Park & Associates, PLC

(57) ABSTRACT

A display device including a first pixel electrode and a second pixel electrode disposed adjacent to each other on a substrate; a pixel defining layer including a first opening corresponding to the first pixel electrode, a second opening corresponding to the second pixel electrode, and a first convex portion arranged adjacent to the first opening; a first intermediate layer arranged on the first pixel electrode to correspond to the first opening and including a first emission layer; and a first conductive inorganic layer arranged on the first intermediate layer to correspond to the first opening. At least one end of the first conductive inorganic layer extends beyond an end of the first intermediate layer and is disposed on the pixel defining layer between the first opening and the second opening.

19 Claims, 20 Drawing Sheets

(51) Int. Cl.
*H01L 29/18* (2006.01)
*H01J 1/63* (2006.01)
*H01L 51/00* (2006.01)

(52) U.S. Cl.
CPC ...... *H01L 51/5225* (2013.01); *H01L 27/3216* (2013.01); *H01L 2227/323* (2013.01)

(56) References Cited

U.S. PATENT DOCUMENTS

| | | | |
|---|---|---|---|
| 6,060,728 | A | 5/2000 | Ghosh et al. |
| 6,500,604 | B1 | 12/2002 | Dimitrakopoulos et al. |
| 6,617,186 | B2 | 9/2003 | Kashiwabara |
| 7,294,452 | B2 | 11/2007 | Tachikawa et al. |
| 7,396,269 | B2 | 7/2008 | Tachikawa et al. |
| 7,534,557 | B2 | 5/2009 | Tachikawa et al. |
| 7,718,352 | B2 | 5/2010 | Tachikawa et al. |
| 7,736,921 | B2 | 6/2010 | Tachikawa et al. |
| 8,043,793 | B2 | 10/2011 | Lizumi et al. |
| 8,513,038 | B2 | 8/2013 | Moriyama et al. |
| 8,778,600 | B2 | 7/2014 | Suh et al. |
| 8,871,537 | B2 | 10/2014 | Yoshitoku et al. |
| 8,877,532 | B2 | 11/2014 | Hiroki et al. |
| 9,040,320 | B2 | 5/2015 | Park et al. |
| 9,054,315 | B2 | 6/2015 | Otsuka et al. |
| 9,054,341 | B2 | 6/2015 | Kim et al. |
| 2002/0014836 | A1 | 2/2002 | Codama et al. |
| 2005/0048414 | A1 | 3/2005 | Harnack et al. |
| 2005/0263775 | A1* | 12/2005 | Ikeda .......... G09G 3/3291 257/79 |
| 2006/0024524 | A1 | 2/2006 | Tachikawa |
| 2006/0105492 | A1 | 5/2006 | Veres et al. |
| 2007/0123135 | A1* | 5/2007 | Yang .......... H01L 27/3213 445/24 |
| 2009/0136877 | A1 | 5/2009 | Suganuma |
| 2010/0289019 | A1 | 11/2010 | Katz et al. |
| 2011/0171763 | A1 | 7/2011 | Lee et al. |
| 2013/0084531 | A1 | 4/2013 | Hamaguchi et al. |
| 2013/0109118 | A1 | 5/2013 | Shiozaki et al. |
| 2013/0210176 | A1 | 8/2013 | Fushimi et al. |
| 2013/0236999 | A1 | 9/2013 | Lee et al. |
| 2014/0004642 | A1 | 1/2014 | Otsuka et al. |
| 2014/0127625 | A1 | 5/2014 | DeFranco et al. |
| 2014/0197394 | A1 | 7/2014 | Otsuka et al. |
| 2014/0284588 | A1* | 9/2014 | Takeuchi .......... H01L 27/3246 257/40 |
| 2014/0322850 | A1 | 10/2014 | Lee et al. |
| 2014/0329354 | A1 | 11/2014 | Defranco |
| 2014/0342287 | A1 | 11/2014 | Wright et al. |
| 2014/0346468 | A1* | 11/2014 | Kim .......... H01L 27/3246 257/40 |
| 2014/0356788 | A1 | 12/2014 | Wright et al. |
| 2014/0356789 | A1 | 12/2014 | Wright et al. |
| 2015/0030981 | A1 | 1/2015 | Robello et al. |
| 2015/0030982 | A1 | 1/2015 | Robello et al. |
| 2015/0044801 | A1 | 2/2015 | Lee et al. |
| 2015/0132699 | A1 | 5/2015 | Robello et al. |
| 2015/0236308 | A1 | 8/2015 | Kim et al. |
| 2015/0331325 | A1 | 11/2015 | Defranco et al. |
| 2015/0362855 | A1 | 12/2015 | Mizuno et al. |
| 2015/0364685 | A1 | 12/2015 | DeFranco et al. |
| 2015/0364716 | A1 | 12/2015 | Shiobara et al. |
| 2017/0271612 | A1* | 9/2017 | Matsuzawa .......... H01L 51/5012 |

FOREIGN PATENT DOCUMENTS

| | | |
|---|---|---|
| JP | 1997-293589 | 11/1997 |
| JP | 2002-170669 | 6/2002 |
| JP | 2003-036971 | 2/2003 |
| JP | 2003-045656 | 2/2003 |
| JP | 2003-297549 | 10/2003 |
| JP | 2003-317949 | 11/2003 |
| JP | 2003-317950 | 11/2003 |
| JP | 2004-006231 | 1/2004 |
| JP | 2004-014203 | 1/2004 |
| JP | 2004-228011 | 8/2004 |
| JP | 2005-191526 | 7/2005 |
| JP | 2005-302351 | 10/2005 |
| JP | 2006-040741 | 2/2006 |
| JP | 2007-066626 | 3/2007 |
| JP | 2007-287537 | 11/2007 |
| JP | 2006-078590 | 4/2008 |
| JP | 2008-098106 | 4/2008 |
| JP | 2008-147072 | 6/2008 |
| JP | 2009-087760 | 4/2009 |
| JP | 2012-216501 | 11/2012 |
| JP | 2013-097947 | 5/2013 |
| JP | 2013-101857 | 5/2013 |
| JP | 2013-175414 | 9/2013 |
| JP | 2013-258020 | 12/2013 |
| JP | 2014-011084 | 1/2014 |
| JP | 2014-123441 | 7/2014 |
| JP | 2014-133727 | 7/2014 |
| JP | 2014-135250 | 7/2014 |
| JP | 2014-150057 | 8/2014 |
| JP | 2016-004910 | 1/2016 |
| JP | 2016-021380 | 2/2016 |
| KR | 10-1994-0025393 | 11/1994 |
| KR | 10-1995-0007603 | 3/1995 |
| KR | 10-2000-0073038 | 12/2000 |
| KR | 10-2002-0024553 | 3/2002 |
| KR | 10-2004-0106450 | 12/2004 |
| KR | 10-2007-0011009 | 1/2007 |
| KR | 10-2007-0059877 | 6/2007 |
| KR | 10-2011-0082415 | 7/2011 |
| KR | 10-2012-0122951 | 11/2012 |
| KR | 10-2013-0032248 | 4/2013 |
| KR | 10-2013-0033258 | 4/2013 |
| KR | 10-2013-0035898 | 4/2013 |
| KR | 10-2013-0035920 | 4/2013 |
| KR | 10-2013-0058618 | 6/2013 |
| KR | 10-2014-0020674 | 2/2014 |
| KR | 10-2014-0080598 | 7/2014 |
| KR | 10-2014-0082089 | 7/2014 |
| KR | 10-2014-0139785 | 12/2014 |
| KR | 10-2014-0143861 | 12/2014 |
| KR | 10-2015-0017612 | 2/2015 |
| KR | 10-2015-0038800 | 4/2015 |
| KR | 10-2015-0044315 | 4/2015 |
| KR | 10-2015-0077157 | 7/2015 |

\* cited by examiner

DISPLAY DEVICE

CROSS-REFERENCE TO RELATED APPLICATION

This application claims priority from and the benefit of Korean Patent Application No. 10-2017-0077584, filed on Jun. 19, 2017, which is hereby incorporated by reference for all purposes as if fully set forth herein.

BACKGROUND

Field

Exemplary embodiments relate to a display device.

Discussion of the Background

Organic light-emitting display devices are display devices including pixels, each pixel including an organic light-emitting diode (OLED). An OLED may include a pixel electrode, an opposite electrode facing the pixel electrode, and an emission layer between the pixel electrode and the opposite electrode.

In an organic light-emitting display device capable of displaying a full color image, light having different colors may be emitted from pixel regions, and an emission layer of each pixel and an opposite electrode provided as a common body (or layer) over a plurality of pixels may be formed using deposition masks. As resolution of the organic light-emitting display device becomes higher, the widths of open slits of a deposition mask used during a deposition process have become narrower, and the spacing between the open slits are required to be further reduced. Also, in order to manufacture organic light-emitting display devices having even higher resolutions, it is necessary to reduce or remove shadow effects. Accordingly, methods of performing deposition processes with substrates and masks in close contact may be used.

However, when a deposition process is conducted with a substrate and a mask in close contact, the mask may damage a pixel defining layer. To prevent this problem, a spacer may be arranged on the pixel defining layer. However, to this end, another process needs to be added, and the spacer may increase the thickness of the organic light-emitting display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device capable of preventing an end of a conductive inorganic layer disposed on an intermediate layer from being insufficiently deposited or being separated from a pixel defining layer while forming the intermediate layer including an emission layer via a lift-off process. The resulting display device is capable of improving display quality without emitting light between pixels in a non-uniform manner.

Additional aspects will be set forth in the detailed description which follows, and, in part, will be apparent from the disclosure, or may be learned by practice of the inventive concept.

According to exemplary embodiments, a display device includes a first pixel electrode and a second pixel electrode disposed adjacent to each other on a substrate; a pixel defining layer including a first opening corresponding to the first pixel electrode, a second opening corresponding to the second pixel electrode, and a first convex portion disposed adjacent to the first opening; a first intermediate layer disposed on the first pixel electrode and arranged to correspond to the first opening and including a first emission layer; and a first conductive inorganic layer disposed on the first intermediate layer and arranged to correspond to the first opening. At least one end of the first conductive inorganic layer extends beyond an end of the first intermediate layer and is disposed on the pixel defining layer between the first opening and the second opening.

The first convex portion may include a first lateral surface directed toward the first opening and a second lateral surface opposite to the first lateral surface, and a peak of the first convex portion may be arranged between the first lateral surface and the second lateral surface.

The at least one end of the first conductive inorganic layer may extend over the second lateral surface beyond the peak of the first convex portion.

An end of the first intermediate layer may extend over the second lateral surface beyond the peak of the first convex portion.

An angle between the second lateral surface and a main surface of the substrate may be less than 90°.

The at least one end of the first conductive inorganic layer may directly contact the pixel defining layer.

The at least one end of the first conductive inorganic layer may extend beyond an end of the first intermediate layer by 0.5 µm or more.

The first conductive inorganic layer may include a metal layer including silver (Ag), magnesium (Mg), aluminum (Al), ytterbium (Yb), calcium (Ca), lithium (Li), gold (Au), or a compound thereof.

The first conductive inorganic layer may include a transparent conductive oxide (TCO).

The first intermediate layer may further include at least one of a first functional layer disposed between the first pixel electrode and the first emission layer and a second functional layer disposed between the first emission layer and the first conductive inorganic layer.

According to one or more embodiments, a display device includes a first pixel electrode and a second pixel electrode disposed adjacent to each other; a pixel defining layer including a first opening corresponding to the first pixel electrode, a second opening corresponding to the second pixel electrode, a first convex portion adjacent to the first opening, and a second convex portion adjacent to the second opening; a first intermediate layer disposed on the first pixel electrode and including a first emission layer; a second intermediate layer disposed on the second pixel electrode and including a second emission layer; a first conductive inorganic layer disposed on the first intermediate layer and configured to cover an end of the first intermediate layer; and a second conductive inorganic layer disposed on the second intermediate layer and configured to cover an end of the second intermediate layer.

At least one end of the first conductive inorganic layer may extend over an end of the first intermediate layer and directly contact the pixel defining layer.

At least one end of the first conductive inorganic layer may extend farther toward the second convex portion than an end of the first intermediate layer.

The first convex portion may include a first lateral surface directed toward the first opening and a second lateral surface opposite to the first lateral surface, and a peak of the first convex portion may be arranged between the first lateral surface and the second lateral surface. At least one end of the first conductive inorganic layer may extend over the second lateral surface beyond the peak of the first convex portion.

The pixel definition layer may further include an additional convex portion disposed between the first convex portion and the second convex portion.

At least one end of the first conductive inorganic layer and at least one end of the second conductive inorganic layer may be arranged between a peak of the first convex portion and a peak of the second convex portion.

The display device may further include a common opposite electrode disposed on the first conductive inorganic layer and the second conductive inorganic layer and configured to cover the first conductive inorganic layer and the second conductive inorganic layer.

At least one of the first conductive inorganic layer and the second conductive inorganic layer may include at least one of a conductive metal layer and a conductive oxide layer.

The conductive metal layer may include silver (Ag), magnesium (Mg), aluminum (Al), ytterbium (Yb), calcium (Ca), lithium (Li), gold (Au), or a compound thereof.

The conductive oxide layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

In display devices according to exemplary embodiments of the inventive concepts, an end of a conductive inorganic layer may extend beyond an end of an intermediate layer by a sufficient length to thereby increase adhesion with a pixel defining layer, and a thickness of the end of the conductive inorganic layer may be increased to thereby prevent the end of the conductive inorganic layer from being peeled off. The aforementioned effects are exemplary, and effects according to embodiments will be described in detail in the descriptions below.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
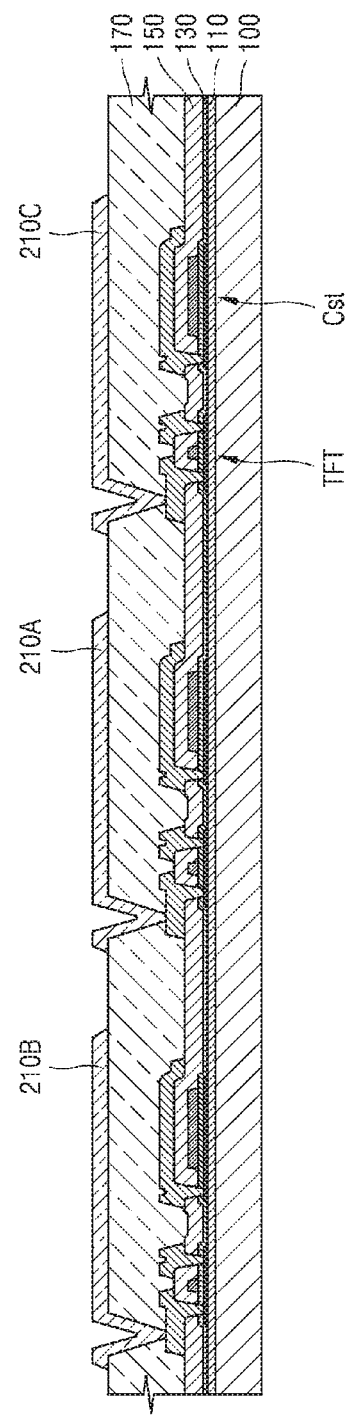
FIG. 1, FIG. 2, FIG. 3, FIG. 4, FIG. 5, FIG. 6, FIG. 7, FIG. 8, FIG. 9, FIG. 10, and FIG. 11 are cross-sectional views schematically illustrating a method of manufacturing a display device, according to an exemplary embodiment of the inventive concepts.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 12A:
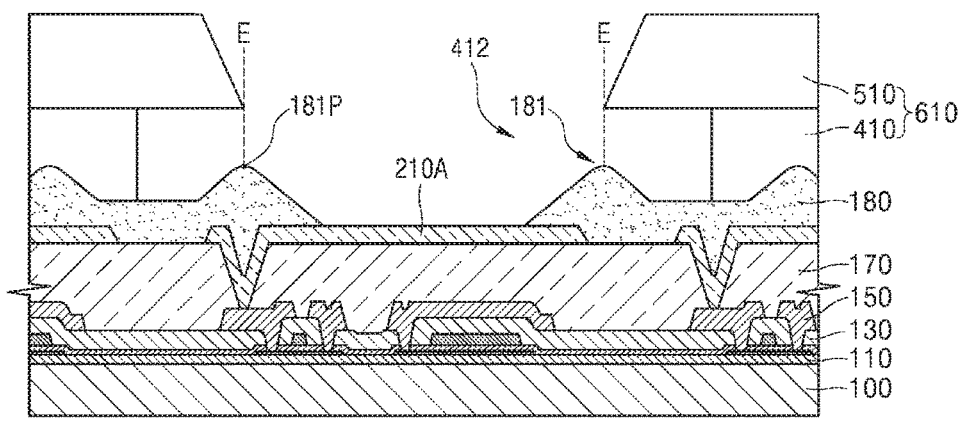
FIG. 12A and FIG. 12B are cross-sectional views illustrating a process of FIG. 3 in more detail.
Figure 12B:
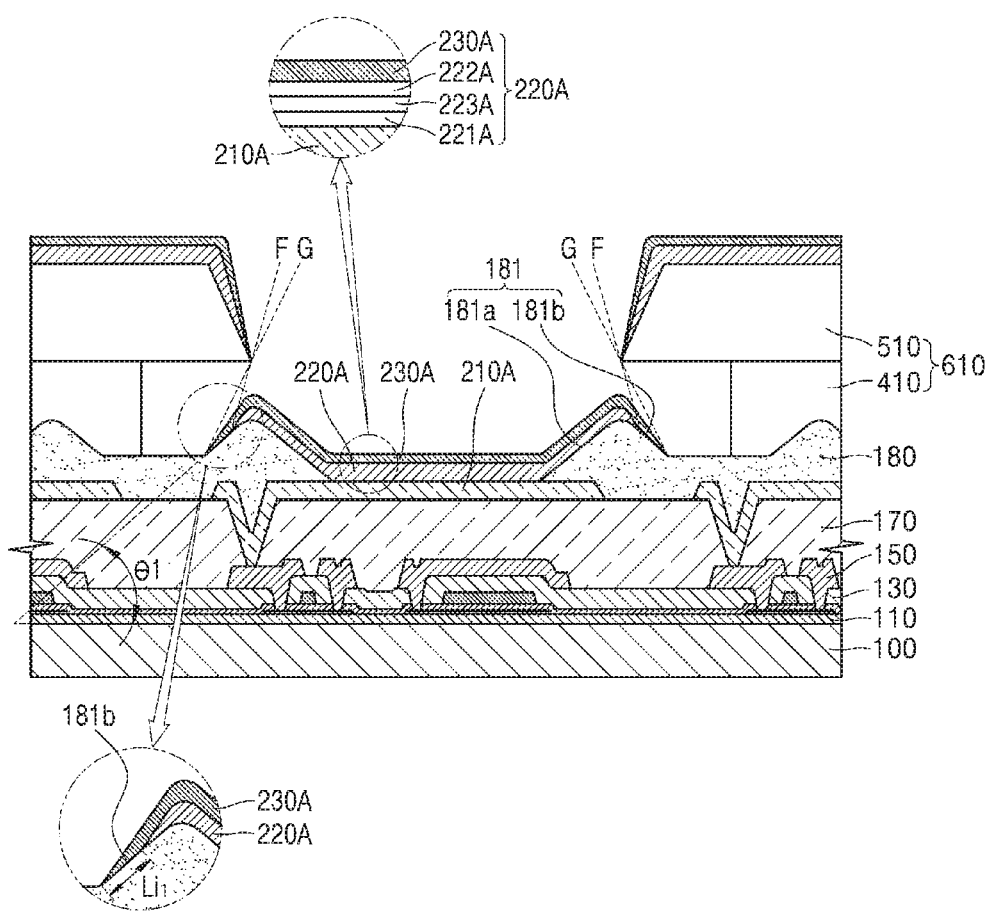
Figure 13A:
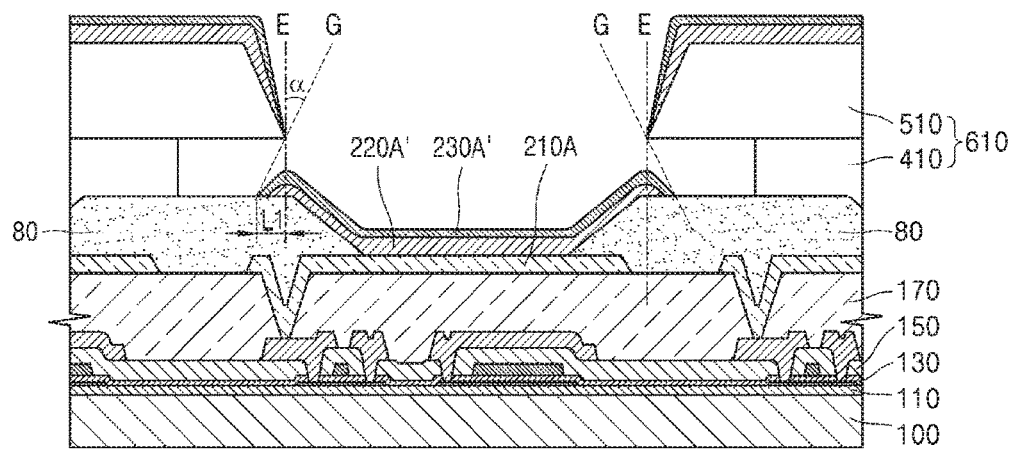
FIG. 13A and FIG. 13B are cross-sectional views illustrating a process according to a comparative example and a process according to an exemplary embodiment of the inventive concepts, respectively.
Figure 13B:
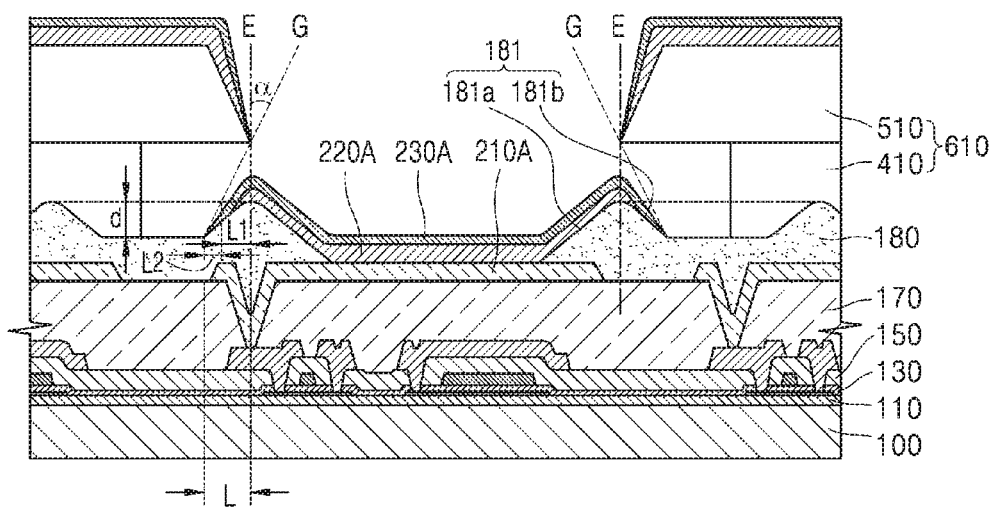

FIG. 1 through FIG. 11 are cross-sectional views schematically illustrating a method of manufacturing a display device, according to an exemplary embodiment of the inventive concepts. FIGS. 12A and 12B are cross-sectional views illustrating a process of FIG. 3 in more detail. FIGS. 13A and 13B are cross-sectional views illustrating a process according to a comparative example and a process according to an exemplary embodiment of the inventive concepts, respectively.

Referring to FIG. 1, a first pixel electrode 210A, a second pixel electrode 210B, and a third pixel electrode 210C are formed on a substrate 100. The first, second, and third pixel electrodes 210A, 210B, and 210C may be formed on the same layer. For example, the first, second, and third pixel electrodes 210A, 210B, and 210C may be formed on a planarization insulating layer 170.

Before the first, second, and third pixel electrodes 210A, 210B, and 210C are formed, various layers may be first formed. Referring to FIG. 1, a thin film transistor TFT and a storage capacitor Cst are formed on the substrate 100, the planarization insulating layer 170 is then formed to cover the thin film transistor TFT and the storage capacitor Cst, and then the first, second, and third pixel electrodes 210A, 210B, and 210C are formed on the planarization insulating layer 170.

The substrate 100 may be formed of any of various materials, for example, glass, metal, or plastic such as polyethylene terephthalate (PET), polyethylene naphthalate (PEN), or polyimide (PI). On the substrate 100, a buffer layer 110 for preventing impurities from permeating into a semiconductor layer of the thin-film transistor TFT, a gate insulating layer 130 for insulating the semiconductor layer of the thin-film transistor TFT from a gate electrode of the thin-film transistor TFT, an interlayer insulating layer 150 for insulating source and drain electrodes of the thin-film transistor TFT from the gate electrode thereof, and the planarization insulating layer 170 having an approximately flat top surface and covering the thin-film transistor TFT may be formed.

The buffer layer 110 may be formed of an oxide layer (e.g., a silicon oxide ($SiO_x$) layer) and/or a nitride layer (e.g., a silicon nitride ($SiN_x$) layer). The gate insulating layer 130 and the interlayer insulating layer 150 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_2$), or the like. The planarization insulating layer 170 may include an organic material, such as acryl, benzocyclobutene (BCB), polyimide, or hexamethyldisiloxane (HMDSO). Although insulating layers ranging from the buffer layer 110 to the planarization insulating layer 170 are described with reference to FIG. 1, exemplary embodiments are not limited thereto. According to another exemplary embodiment, a greater number of insulating layers than described above may be arranged according to various structures of the thin film transistor TFT and the storage capacitor Cst.

The first, second, and third pixel electrodes 210A, 210B, and 210C may be formed of a conductive oxide, for example, indium tin oxide (ITO), indium zinc oxide (IZO), zinc oxide (ZnO), indium oxide ($In_2O_3$), indium gallium oxide (IGO), or aluminum zinc oxide (AZO). Alternatively, the first, second, and third pixel electrodes 210A, 210B, and 210C may include a reflection layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and/or a layer formed of ITO, IZO, ZnO or $In_2O_3$ on the reflection layer. Each of the first, second, and third pixel electrodes 210A, 210B, and 210C may be formed as a single layer or a multi-layer structure.

Figure 2:
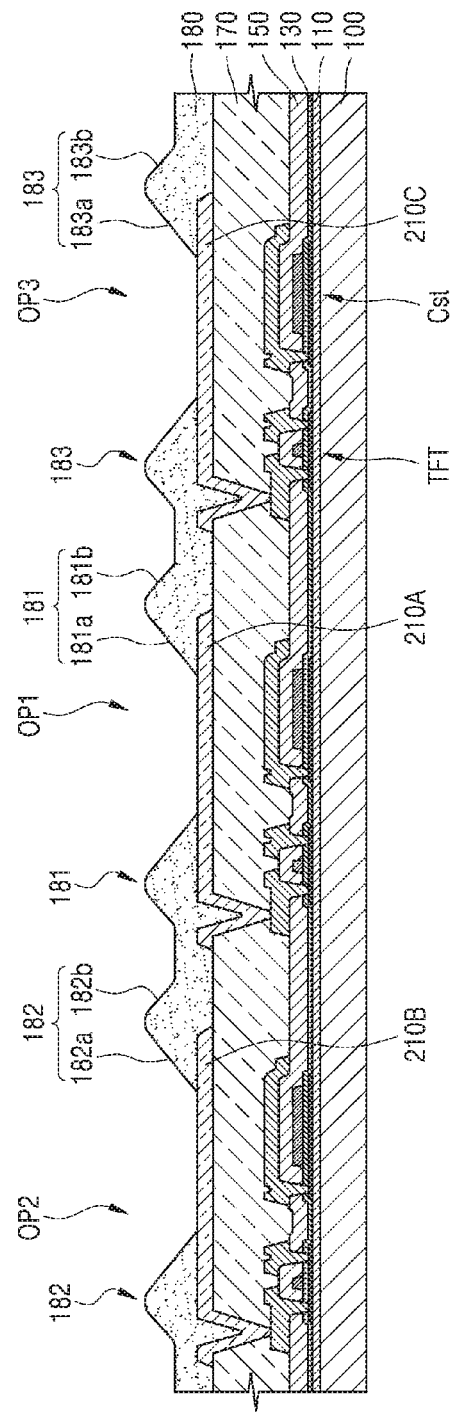

Referring to FIG. 2, a pixel defining layer 180 is formed on the first, second, and third pixel electrodes 210A, 210B, and 210C. The pixel defining layer 180 may define sub-pixels by having first, second, and third openings OP1, OP2, and OP3 respectively corresponding to the sub-pixels, namely, first, second, and third openings OP1, OP2, and OP3 via which at least respective portions of the first, second, and third pixel electrodes 210A, 210B, and 210C including respective center portions thereof are exposed, respectively. The pixel definition layer 180 may also prevent an arc or the like from occurring at an end of each of the first, second, and third pixel electrodes 210A, 210B, and 210C, by increasing a distance between the end of each of the first, second, and third pixel electrodes 210A, 210B, and 210C and each of first through third conductive inorganic layers and/or an common opposite electrode (not shown), which are to be formed in subsequent processes.

The pixel defining layer 180 may include a first convex portion 181 adjacent to the first opening OP1, a second convex portion 182 adjacent to the second opening OP2, and a third convex portion 183 adjacent to the third opening OP3.

The first convex portion 181 and the second convex portion 182 are included on a mound (bank) of the pixel defining layer 180 arranged between the first pixel electrode 210A and the second pixel electrode 210B, and the first convex portion 181 is adjacent to the first opening OP1 and the second convex portion 182 is adjacent to the second opening OP2. The first convex portion 181 may at least partially surround the first opening OP1, the second convex portion 182 may at least partially surround the second opening OP2, and a concave portion may be located between the first convex portion 181 and the second convex portion 182.

The second convex portion 182 and the third convex portion 183 are included on a mound (bank) of the pixel defining layer 180 between the second pixel electrode 210B and the third pixel electrode 210C, and the second convex portion 182 is adjacent to the second opening OP2 and the third convex portion 183 is adjacent to the third opening OP3. The third convex portion 183 may at least partially surround the third opening OP3, and a concave portion may be located between the second convex portion 182 and the third convex portion 183.

The third convex portion 183 and the first convex portion 181 are included on a mound (bank) of the pixel defining layer 180 arranged between the third pixel electrode 210C and the first pixel electrode 210A, and the third convex portion 183 is adjacent to the third opening OP3 and the first convex portion 181 is adjacent to the first opening OP1. A concave portion may be located between the third convex portion 183 and the first convex portion 181.

The first convex portion 181 includes a first lateral surface 181a facing the first opening OP1, and a second lateral surface 181b opposite to the first lateral surface 181a. The first lateral surface 181a and the second lateral surface 181b are connected to each other with a peak of the first convex portion 181 therebetween. The first lateral surface 181a may extend to have a certain inclined angle with respect to a top surface of the first pixel electrode 210A, and the second lateral surface 181b may extend to have a certain inclined angle with respect to the concave portion between the first convex portion 181 and the second convex portion 182 or the concave portion between the first convex portion 181 and the third convex portion 183 to be away from the first pixel electrode 210A in a direction opposite to an extending direction of the first lateral surface 181a.

The second convex portion 182 includes a first lateral surface 182a facing the second opening OP2, and a second lateral surface 182b opposite to the first lateral surface 182a. The first lateral surface 182a and the second lateral surface 182b are connected to each other with a peak of the second convex portion 182 therebetween. The first lateral surface 182a may extend to have a certain inclined angle with respect to a top surface of the second pixel electrode 210B, and the second lateral surface 182b may extend to have a certain inclined angle with respect to the concave portion between the second convex portion 182 and the third convex portion 183 or the concave portion between the second convex portion 182 and the first convex portion 181 to be away from the first pixel electrode 210B in a direction opposite to an extending direction of the first lateral surface 182a.

The third convex portion 183 includes a first lateral surface 183a facing the third opening OP3, and a second lateral surface 183b opposite to the first lateral surface 183a. The first lateral surface 183a and the second lateral surface 183b are connected to each other with a peak of the third convex portion 183 therebetween. The first lateral surface 183a may extend to have a certain inclined angle with respect to a top surface of the third pixel electrode 210C, and the second lateral surface 183b may extend to have a certain inclined angle with respect to the concave portion between the third convex portion 183 and the second convex portion 182 or the concave portion between the third convex portion 183 and the first convex portion 181 to be away from the third pixel electrode 210C in a direction opposite to an extending direction of the first lateral surface 183a.

A height of the pixel defining layer 180, namely, a height from a bottom surface of the pixel defining layer 180 to the peak of each of the first, second, and third convex portions 181, 182, and 183, may be about 1 μm to about 5 μm or about 1 μm to about 4 μm, but exemplary embodiments are not limited thereto.

The pixel defining layer 180 may include an organic material and/or an inorganic material, and may be formed as a single layer or a multi-layer. The organic material may include an olefin-based organic material, an acryl-based organic material, an imide-based organic material, or the like. The imide-based organic material may be PI. The inorganic material may include silicon oxide, silicon nitride, or the like.

The shape of the pixel defining layer 180 including the first, second, and third convex portions 181, 182, and 183 and the concave portions, described above with reference to FIG. 2, may be obtained using a halftone mask, a slit mask, a lattice-type photomask, or the like by adjusting an exposure amount.

Figure 3:
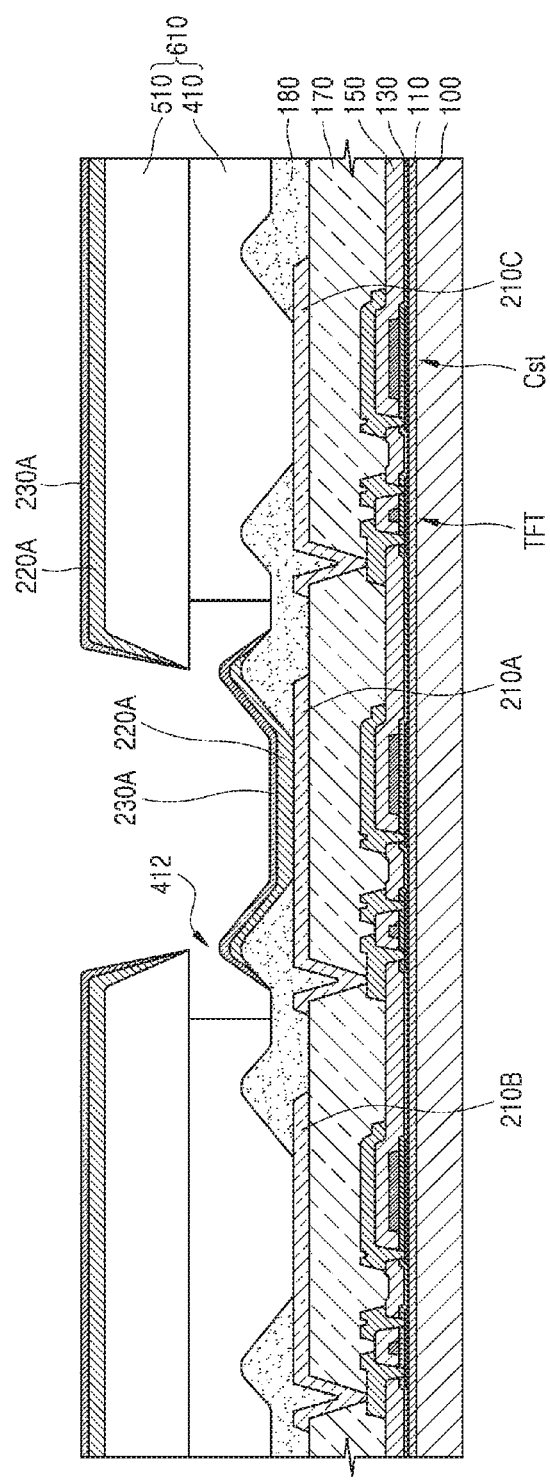

Referring to FIG. 3, a first masking pattern 610 is formed on the substrate 100 on which the pixel defining layer 180 has been formed. For example, a first protective resin layer 410 and a first photoresist layer 510 may be sequentially formed on the substrate 100 on which the pixel defining layer 180 has been formed, thereby forming the first masking pattern 610. The first protective resin layer 410 may include, but is not limited to, a fluoric material containing about 50% by weight of fluorine. The first photoresist layer 510 may include a positive photosensitive material.

Thereafter, a region of the first photoresist layer 510 that corresponds to the first pixel electrode 210A is exposed and developed to thereby form an opening region. The phrases "A corresponds to B" and "A corresponding to B" may be understood as A overlapping with B.

Next, a portion of the first protective resin layer 410 exposed via the opening region of the first photoresist layer 510 may be etched to thereby form a first exposure hole 412 that exposes the first pixel electrode 210A. For example, the first exposure hole 412 may be formed by wet-etching the first protective resin layer 410 by using a stripper (for example, a stripper including hydrofluoro-ether) capable of selectively removing the first protective resin layer 410. The first exposure hole 412 of the first protective resin layer 410 may be formed to be larger than the opening region of the first photoresist layer 510. Accordingly, an end of the first photoresist layer 510 adjacent to the first exposure hole 412 protrudes more than an end of the first protective resin layer 410 adjacent to the first exposure hole 412 to thereby form an eaves structure.

Thereafter, a first intermediate layer 220A and a first conductive inorganic layer 230A are sequentially formed on the substrate 100 on which the first masking pattern 610 has been formed. The first intermediate layer 220A and the first conductive inorganic layer 230A may be sequentially formed on the first pixel electrode 210A via the first exposure hole 412 and may also be formed on the first masking pattern 610.

FIGS. 12A and 12B are cross-sectional views illustrating the process of FIG. 3 in more detail.

Referring to FIG. 12A, the first exposure hole 412 of the first protective resin layer 410 may be formed to be larger than the opening region of the first photoresist layer 510 as described above, and thus, a portion of the first photoresist layer 510 adjacent to the first exposure hole 412 may extend beyond the first protective resin layer 410 in a direction toward the first exposure hole 412. In other words, a region of the first photoresist layer 510 adjacent to the first exposure hole 412 may have an "eaves structure".

The end of the first photoresist layer 510 adjacent to the first exposure hole 412 may be patterned to be aligned with a peak 181p of the first convex portion 181 along on a line E or to be behind the line E (for example, to be over the second lateral surface 181b of the first convex portion 181).

Thereafter, as shown in FIG. 12B, the first intermediate layer 220A and the first conductive inorganic layer 230A may be sequentially formed.

Materials used to form the first intermediate layer 220A move over the first pixel electrode 210A via the first exposure hole 412 (see FIG. 12A). The materials used to form the first intermediate layer 220A pass through the first exposure hole 412, and at this time, an incidence angle of the materials used to form the first intermediate layer 220A may be restricted by the eaves structure of the first photoresist layer 510. A line F of FIG. 12B is an angle at which the materials used to form the first intermediate layer 220A are incident by the eaves structure of the first photoresist layer 510, and thus, an end of the first intermediate layer 220A may be located at the end of the line F. The materials used to form the first intermediate layer 220A may be deposited not only on the top surface of the first pixel electrode 210A but also on the first lateral surface 181a of the first convex portion 181 and a portion of the second lateral surface 181b of the first convex portion 181. The first intermediate layer 220A may be formed by thermal evaporation.

Materials used to form the first conductive inorganic layer 230A move over the first intermediate layer 220A via the first exposure hole 412 (see FIG. 12A). The materials used to form the first conductive inorganic layer 230A pass through the first exposure hole 412, and at this time, an incidence angle of the materials used to form the first conductive inorganic layer 230A may be restricted by the eaves structure of the first photoresist layer 510. A line G of FIG. 12B is an angle at which the materials used to form the first conductive inorganic layer 230A are incident by the eaves structure of the first photoresist layer 510. Because the materials used to form the first conductive inorganic layer 230A are different from the materials of the first intermediate layer 220A in terms of a component, a molecular weight, a deposition method, and the like, the lines G and F form different angles, and an end of the first conductive inorganic layer 230A may be located at the end of the line G. The first conductive inorganic layer 230A may not only cover the entire first intermediate layer 220A, but also an end of the first conductive inorganic layer 230A may extend over the pixel defining layer 180 and thus, directly contact the pixel defining layer 180. The first conductive inorganic layer 230A may be formed by thermal evaporation or sputtering.

As shown in a magnified view of FIG. 12B, the end of the first conductive inorganic layer 230A may extend over the peak of the first convex portion 181, the end of the first intermediate layer 220A, and the second lateral surface 181b of the first convex portion 181, and may directly contact the second lateral surface 181b. The end of the first conductive inorganic layer 230A may extend beyond the end of the first intermediate layer 220A by a predetermined length $Li_1$, which may be about 0.5 μm or greater. Since the end of the first conductive inorganic layer 230A extends beyond the end of the first intermediate layer 220A by about 0.5 μm or greater, the first intermediate layer 220A may be entirely covered and protected, adhesion of the first conductive inorganic layer 230A with the pixel defining layer 180 may be sufficiently secured, and it is possible to prevent the end of the first conductive inorganic layer 230A from peeling off from the pixel defining layer 180 resulting from a stress of the first conductive inorganic layer 230A itself.

The second lateral surface 181b of the first convex portion 181 is overlapped by, and covered with, the eaves of the first photoresist layer 510. Thus, if an angle θ1 between the second lateral surface 181b and a main surface of the substrate 100 is 90° or greater, even when the materials of the first conductive inorganic layer 230A are slantingly incident along the line G, the end of the first conductive inorganic layer 230A may be formed discontinuously (may be cut), and may not cover the end of the first intermediate layer 220A. However, according to exemplary embodiments of the inventive concepts, the angle θ1 between the second lateral surface 181b of the first convex portion 181 and the main surface of the substrate 100 may be formed to be less than 90°, for example, and may be in the range of 10° to 70°, thereby addressing the aforementioned problem.

As shown in another magnified view of FIG. 12B, the first intermediate layer 220A includes a first emission layer 223A. The first emission layer 223A may include a fluorescent material or phosphorescent material capable of emitting light in a first color (e.g., red). First and second functional layers 221A and 222A may be formed on and/or below the first emission layer 223A. The first intermediate layer 220A may be formed such that a center region thereof that overlaps the first pixel electrode 210A has a thickness of about 180 nm to about 300 nm, but the inventive concepts are not limited thereto.

The first functional layer 221A may be a single layer or a multi-layer structure. For example, when the first functional layer 221A is formed of a high molecular weight material, the first functional layer 221A is a single layer of a hole transport layer (HTL), and may be formed of poly-(3,4)-ethylene-dihydroxy thiophene (PEDOT) or polyaniline (PANI). On the other hand, when the first functional layer 221A is formed of a low molecular weight material, the first functional layer 221A may include a hole injection (HIL) and an HTL.

The second functional layer 222A may be formed on the first emission layer 223A to cover the first emission layer 223A. The second functional layer 222A is optional. For example, when the first functional layer 221A and the first emission layer 223A are formed of high molecular weight materials, the second functional layer 222A may be omitted. When the first functional layer 221A and the first emission layer 223A are formed of low molecular weight materials, the second functional layer 222A may be formed to improve the characteristics of an organic light-emitting device. In this case, the second functional layer 222A may have a single layer or multi-layer structure, and the second functional layer 222A may include an electron transport layer (ETL) and/or an electron injection layer (EIL).

The first conductive inorganic layer 230A may include a conductive metal layer including Ag, Mg, Al, ytterbium (Yb), calcium (Ca), lithium (Li), Au, or a compound thereof, or/and a conductive oxide layer such as a transparent conductive oxide (TCO) layer. A TCO may include indium tin oxide (ITO), indium zinc oxide (IZO), zinc oxide (ZnO), indium oxide ($In_2O_3$), indium gallium oxide (IGO), aluminum zinc oxide (AZO), or the like. According to an exemplary embodiment, the first conductive inorganic layer 230A may be an alloy including Ag and Mg, and may be formed as a multi-layer structure including ITO or as a single layer including the aforementioned materials. The first conductive inorganic layer 230A may be formed to have a thickness of about 3 nm to about 15 nm or about 5 nm to about 10 nm, but the thickness of the first conductive inorganic layer 230A is not limited thereto.

The end of the first conductive inorganic layer 230A formed via the process described above with reference to FIGS. 12A and 12B may contact the pixel defining layer 180 and the contact area may be increased due to the shape of the pixel defining layer 180, for example, the shape of the first convex portion 181.

In a comparative example shown in FIG. 13A, when a pixel defining layer 80 has no protrusions, materials used to form a first intermediate layer 220A' and a first conductive inorganic layer 230A' may be slantingly incident and be deposited on the pixel defining layer 80. When the material used to form the first conductive inorganic layer 230A' is incident upon the pixel defining layer 80 along the line G, a distance L1 between the line E and an end of the first conductive inorganic layer 230A' may be about 0.87 μm, about 1.50 μm, or about 2.60 μm as in Table 1 below, according to an incidence angle of the material used to form the first conductive inorganic layer 230A' (for example, an angle α between the lines E and G).

TABLE 1

| Incidence angle (α) | Distance (L1) |
|---|---|
| 30° | 0.87 μm |
| 45° | 1.50 μm |
| 60° | 2.60 μm |

However, as in the exemplary embodiment shown in FIG. 13B, when the pixel defining layer 180 includes a protrusion, for example, the first convex portion 181 and the materials of the first conductive inorganic layer 230A are incident in the same manner as the case of FIG. 13A, a horizontal length L (L=L1+L2) from the line E to the end of the first conductive inorganic layer 230A may be greater than the distance L1 of FIG. 13A by a distance L2. The distance L2 may be proportional to a depth d of the concave portion adjacent to the first convex portion 181 (L2=d×tan α), and may be about 0.58 μm, about 1.00 μm, or about 1.73 μm as in Table 2 below according to the incidence angle (for example, an angle α between the lines E and G). Table 2 shows a result of a simulation of a case where the depth d of the concave portion of the pixel defining layer 180 is about 1 μm.

TABLE 2

| Incidence angle (α) | Distance (L1) | Distance (L2) |
|---|---|---|
| 30° | 0.87 μm | 0.58 μm |
| 45° | 1.50 μm | 1.00 μm |
| 60° | 2.60 μm | 1.73 μm |

As described above with references to FIGS. 13A and 13B, when the pixel defining layer 180 includes the first convex portion 181 having the first and second lateral surfaces 181a and 181b, the end of the first conductive inorganic layer 230A may cover or contact the pixel defining layer 180 and the cover or contact area may be increased due to the shape of the pixel defining layer 180. In addition, due to the second lateral surface 181b of the first convex portion 181, having a certain inclination, the end of the first conductive inorganic layer 230A may have a sufficient thickness enough to cover not only the first intermediate layer 220A but also the pixel defining layer 180. Thus, a problem, such as detachment of the end of the first conductive inorganic layer 230A from the pixel defining layer 180 due to the stress of the first conductive inorganic layer 230A itself or decrease of adhesive force between the end of the conductive inorganic layer 230A and the pixel defining layer 180, may be prevented.

Referring back to FIG. 4, the first masking pattern 610 of FIG. 3 is removed via a lift-off process. For example, when the first protective resin layer 410 (see FIG. 3) is removed by using a fluoric solvent, the first photoresist layer 510, the first intermediate layer 220A, and the first conductive inorganic layer 230A stacked on the first protective resin layer 410 may also be removed.

Via the lift-off process, the first intermediate layer 220A and the first conductive inorganic layer 230A may remain on the first pixel electrode 210A, and may form a light-emitting device, for example, an organic light-emitting device, that emits light in the first color.

Figure 4:
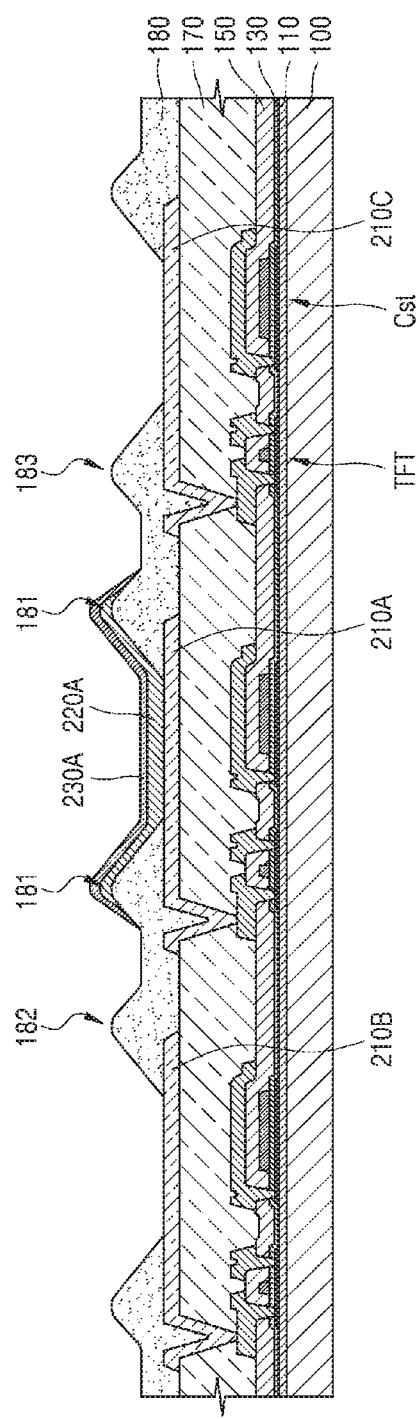

Via the process of FIGS. 3 and 4 of patterning the first intermediate layer 220A and the first conductive inorganic layer 230A by using the first masking pattern 610, ends of the first intermediate layer 220A and the first conductive inorganic layer 230A on the first pixel electrode 210A, particularly, an end of the first conductive inorganic layer 230A, may be located on the mound of the pixel defining layer 180 between the first pixel electrode 210A and a pixel electrode adjacent to the first pixel electrode 210A. For example, the end of the first conductive inorganic layer 230A may be located on the mound of the pixel defining layer 180 between the first opening OP1 and the second opening OP2 or the mound of the pixel defining layer 180 between the first opening OP1 and the third opening OP3. In more detail, the end of the first conductive inorganic layer 230A may be located between the first convex portion 181 and the second convex portion 182 or/and between the first convex portion 181 and the third convex portion 183.

Figure 5:
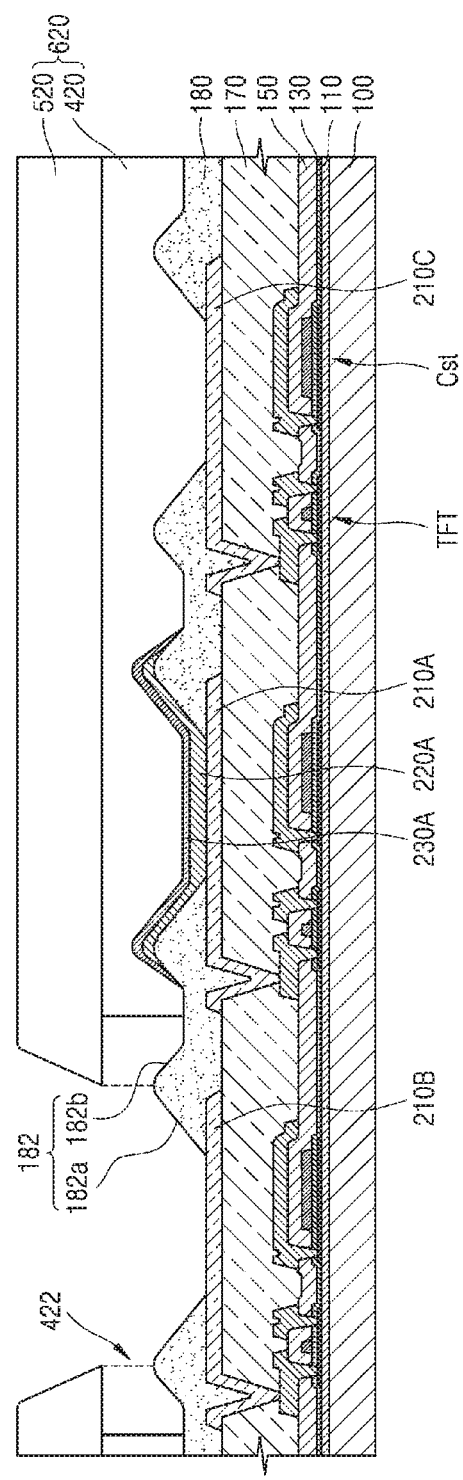

Referring to FIG. 5, a second protective resin layer 420 is formed on the substrate 100 on which the first intermediate layer 220A and the first conductive inorganic layer 230A have been formed, and a second photoresist layer 520 is formed on the second protective resin layer 420. The second protective resin layer 420 may include a fluoric material containing about 50% by weight of fluorine, and the second photoresist layer 520 may include a positive photosensitive material.

A portion of the second photoresist layer 520 corresponding to the second pixel electrode 210B is exposed and developed to form an opening region, and a portion of the second protective resin layer 420 exposed via the opening region is etched to form a second exposure hole 422. The second protective resin layer 420 including the second exposure hole 422, and the second photoresist layer 520 may form a second masking pattern 620.

The second exposure hole 422 may be formed to be larger than the opening region of the second photoresist layer 520, and the second photoresist layer 520 may have an eaves structure. An end of the first photoresist layer 520 adjacent to the second exposure hole 422 may be located in alignment with a peak of the second convex portion 182 or may be located behind the peak of the second convex portion 182, for example, on the second lateral surface 182b of the second convex portion 182. Accordingly, the second lateral surface 182b of the second convex portion 182 may be at least partially overlapped by the second photoresist layer 520.

Figure 6:
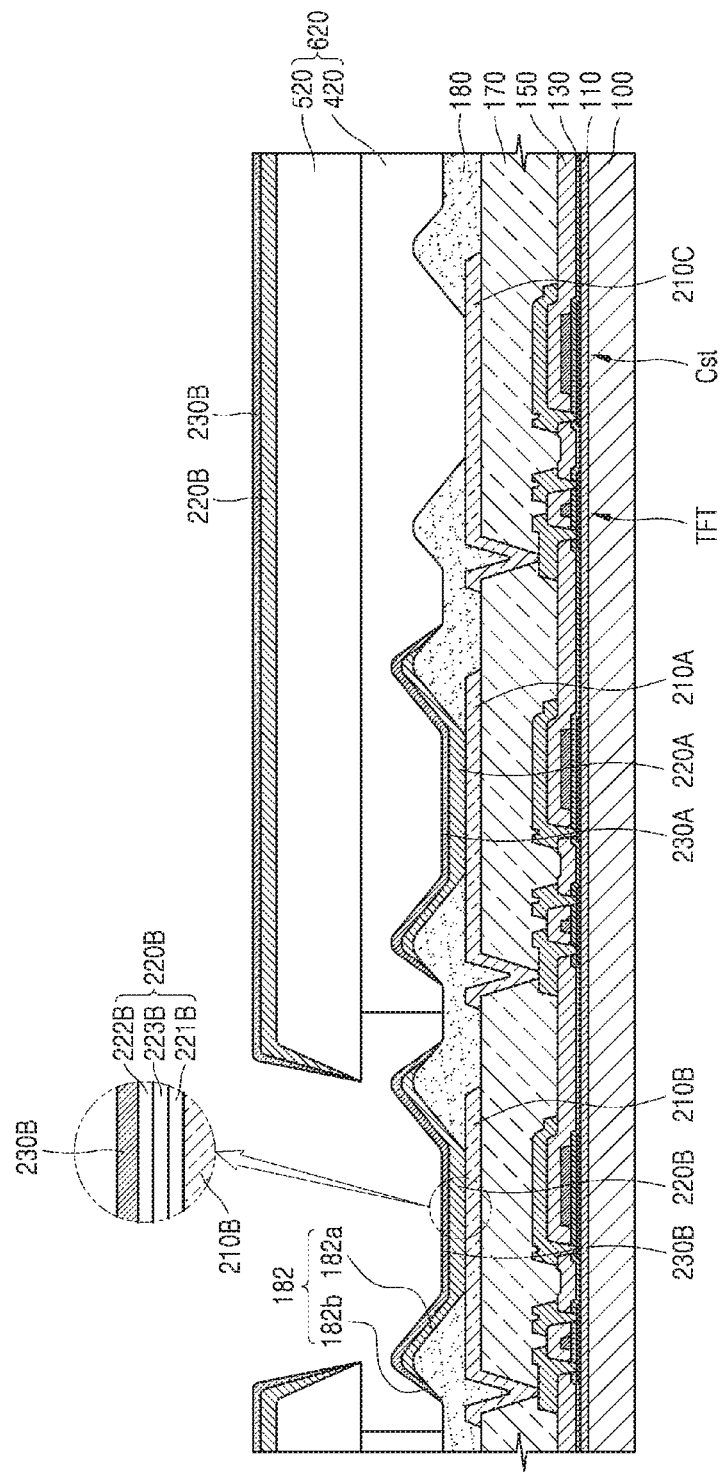

Referring to FIG. 6, a second intermediate layer 220B and a second conductive inorganic layer 230B are sequentially formed on the substrate 100 on which the second masking pattern 620 has been formed.

The second conductive inorganic layer 230B may cover the second intermediate layer 220B, but an end of the second conductive inorganic layer 230B may extend beyond an end of the second intermediate layer 220B. For example, the end of the second conductive inorganic layer 230B may extend over the peak of the second convex portion 182 and the second lateral surface 182b and may directly contact the pixel defining layer 180. FIG. 6 illustrates a structure in which the end of the second conductive inorganic layer 230B directly contacts the second lateral surface 182b of the second convex portion 182.

As shown in the magnified view of FIG. 6, the second intermediate layer 220B includes a second emission layer 223B. The second emission layer 223B may include a fluorescent material or phosphorescent material capable of emitting light in a second color (e.g., green). First and second functional layers 221B and 222B may be formed on and/or below the second emission layer 223B. The first functional layer 221B may include an HTL and/or an HIL, and the second functional layer 222B may include an ETL and/or an EIL.

The second conductive inorganic layer 230B may include a metal layer including Ag, Mg, Al, Yb, Ca, Li, Au, or a compound thereof, or/and a TCO layer. The second conductive inorganic layer 230B may be a single layer or multi-layer of the aforementioned materials.

Figure 7:
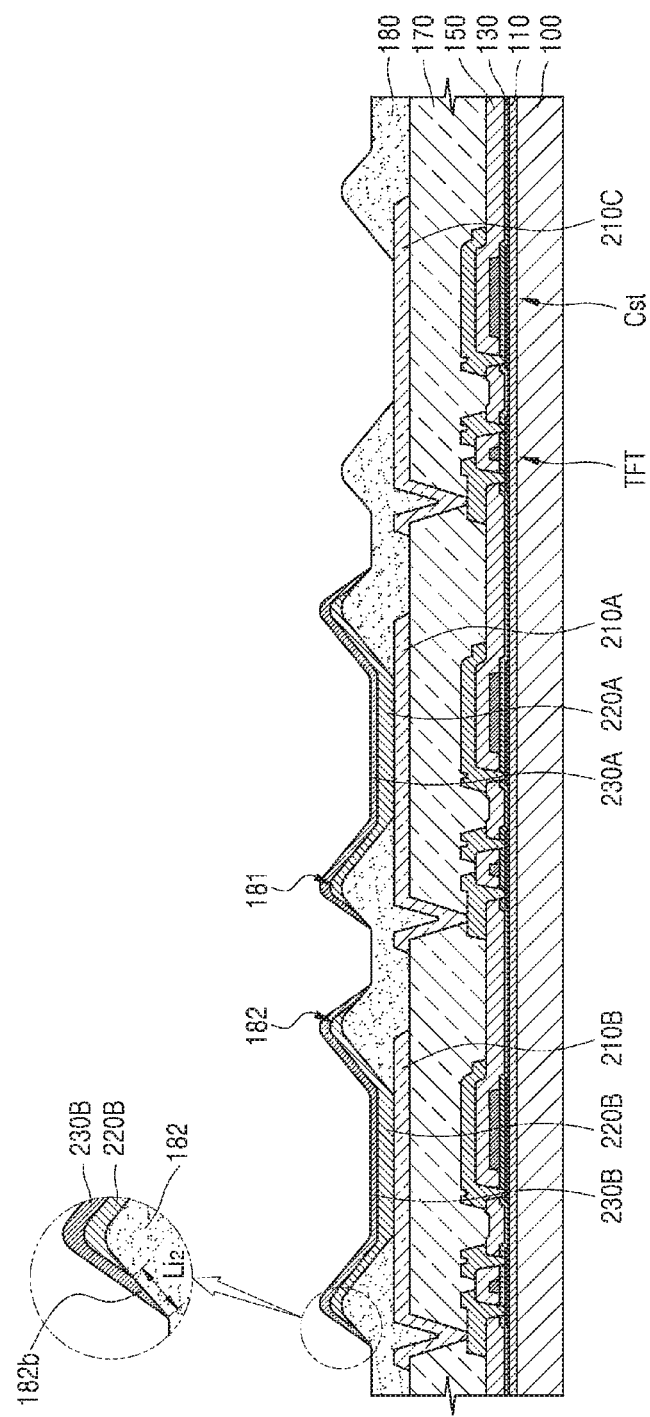

Referring to FIG. 7, the second masking pattern 620 is removed via a lift-off process. For example, when the second protective resin layer 420 (see FIG. 6) is removed by using a fluoric solvent, the second photoresist layer 520, the second intermediate layer 220B, and the second conductive inorganic layer 230B stacked on the second protective resin layer 420 may also be removed.

The second intermediate layer 220B and the second conductive inorganic layer 230B may remain on the second pixel electrode 210B, and the second intermediate layer 220B may be entirely covered with the second conductive inorganic layer 230B. The end of the second conductive inorganic layer 230B may extend over the second lateral surface 182b of the second convex portion 182 of the pixel defining layer 180 beyond the end of the second intermediate layer 220B and may directly contact the second lateral surface 182b. A length $Li_2$ corresponding to a distance between the end of the second conductive inorganic layer 230B and the end of the second intermediate layer 220B may be about 0.5 μm or greater. Since the end of the second conductive inorganic layer 230B extends beyond the end of the second intermediate layer 220B by about 0.5 μm or greater, the second intermediate layer 220B may be entirely covered and protected, adhesion of the second conductive inorganic layer 230B with the pixel defining layer 180 may be sufficiently secured, and it is possible to prevent the end of the second conductive inorganic layer 230B from peeling off from the pixel defining layer 180 due to a stress of the second conductive inorganic layer 230B itself.

Via the process of FIGS. 6 and 7 of patterning the second intermediate layer 220B and the second conductive inorganic layer 230B by using the second masking pattern 620, the ends of the second intermediate layer 220B and the second conductive inorganic layer 230B on the second pixel electrode 210B, particularly, the end of the second conductive inorganic layer 230B, may be located on the mound of the pixel defining layer 180 between the second pixel electrode 210B and a pixel electrode adjacent to the second pixel electrode 210B. For example, the end of the second conductive inorganic layer 230B may be located on the mound of the pixel defining layer 180 between the second opening OP2 and the first opening OP1 or the mound of the pixel defining layer 180 between the second opening OP2 and the third opening OP3. In more detail, the end of the second conductive inorganic layer 230B may be located between the second convex portion 182 and the first convex portion 181 or/and between the second convex portion 182 and the third convex portion 183.

Figure 8:
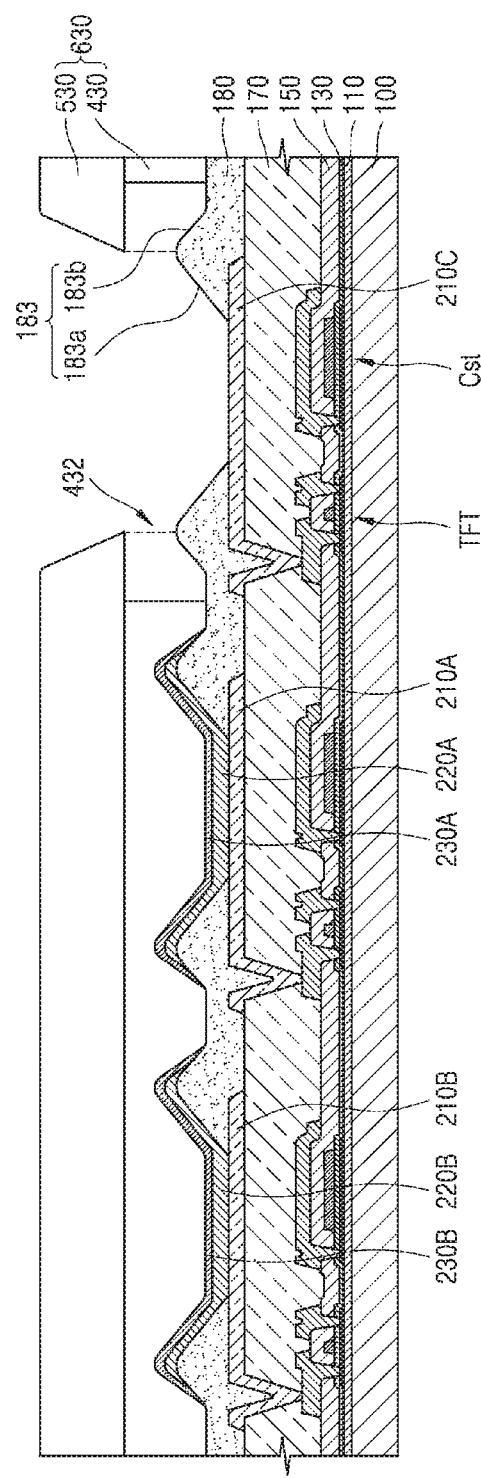

Referring to FIG. 8, a third protective resin layer 430 is formed on the substrate 100 on which the second intermediate layer 220B and the second conductive inorganic layer 230B have been formed, and a third photoresist layer 530 is formed on the third protective resin layer 430. The third protective resin layer 430 may include a fluoric material containing about 50% by weight of fluorine, and the third photoresist layer 530 may include a positive photosensitive material.

A portion of the third photoresist layer 530 corresponding to the third pixel electrode 210C is exposed and developed to form an opening region, and a portion of the third protective resin layer 430 exposed via the opening region is etched to form a third exposure hole 432. The third protective resin layer 430 including the third exposure hole 432, and the third photoresist layer 530 may form a third masking pattern 630.

The third exposure hole 432 may be formed to be larger than the opening region of the third photoresist layer 530, and the third photoresist layer 530 may have an eaves structure. An end of the third photoresist layer 530 adjacent to the third exposure hole 432 may be located in alignment with a peak of the third convex portion 183, or may be located behind the peak of the third convex portion 183, for example, on the second lateral surface 183b of the second convex portion 183. Accordingly, the second lateral surface 183b of the third convex portion 183 may be at least partially overlapped by the third photoresist layer 530.

Figure 9:
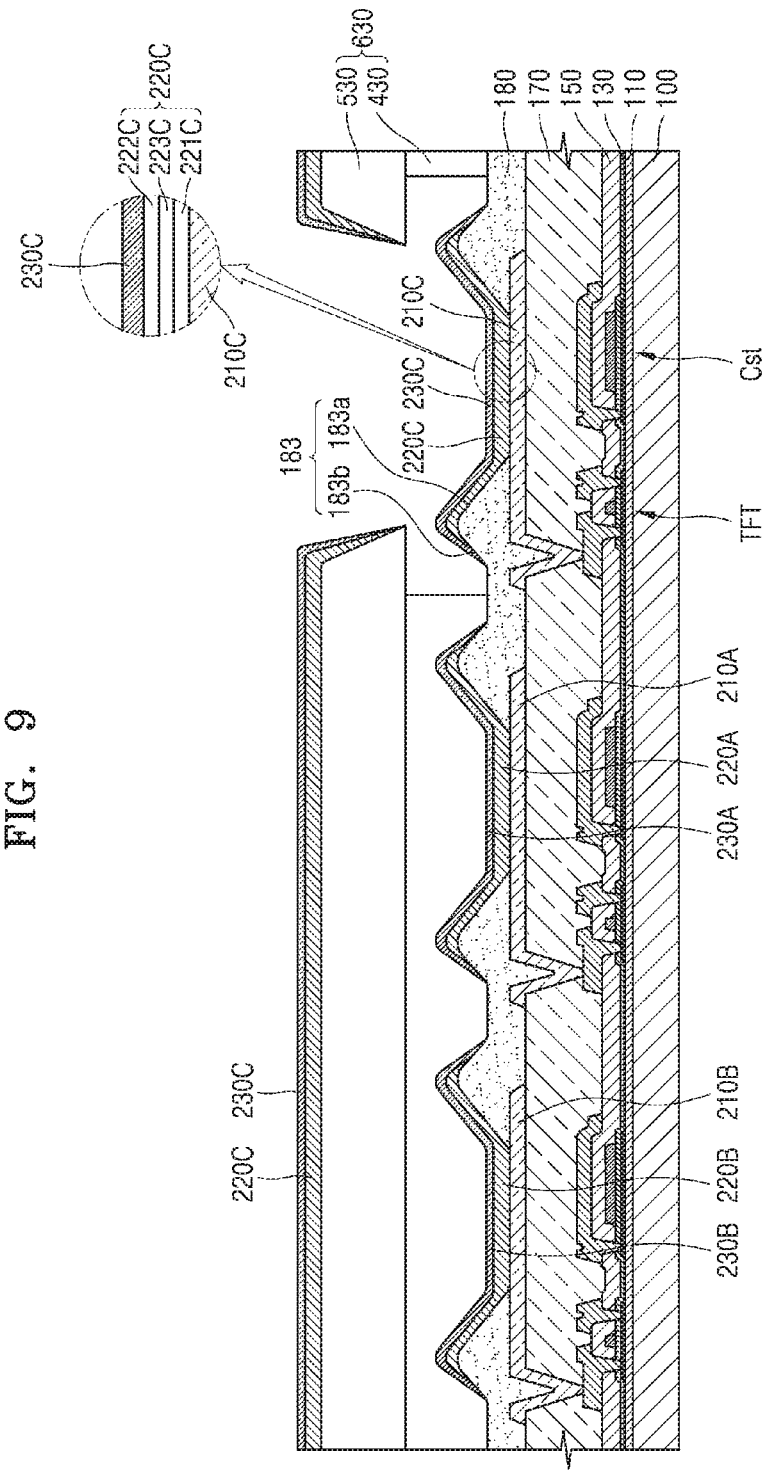

Referring to FIG. 9, a third intermediate layer 220C and a third conductive inorganic layer 230C are sequentially formed on the substrate 100 on which the third masking pattern 630 has been formed.

The third conductive inorganic layer 230C may cover the third intermediate layer 220C, but an end of the second conductive inorganic layer 230C may extend beyond an end of the third intermediate layer 220C. For example, the end of the third conductive inorganic layer 230C may extend over the second lateral surface 183b beyond the peak of the third convex portion 183 and may directly contact the pixel defining layer 180. FIG. 9 illustrates a structure in which the end of the third conductive inorganic layer 230C directly contacts the second lateral surface 183b of the third convex portion 183.

As shown in the magnified view of FIG. 9, the third intermediate layer 220C includes a third emission layer 223C. The third emission layer 223C may include a fluorescent material or phosphorescent material capable of emitting light in a third color (e.g., green). First and second functional layers 221C and 222C may be formed on and/or below the third emission layer 223C. The first functional layer 221C may include an HTL and/or an HIL, and the second functional layer 222C may include an ETL and/or an EIL.

The third conductive inorganic layer 230C may include a metal layer including Ag, Mg, Al, Yb, Ca, Li, Au, or a compound thereof, or/and a TCO layer. The third conductive inorganic layer 230C may be a single layer or multi-layer of the aforementioned materials.

Figure 10:
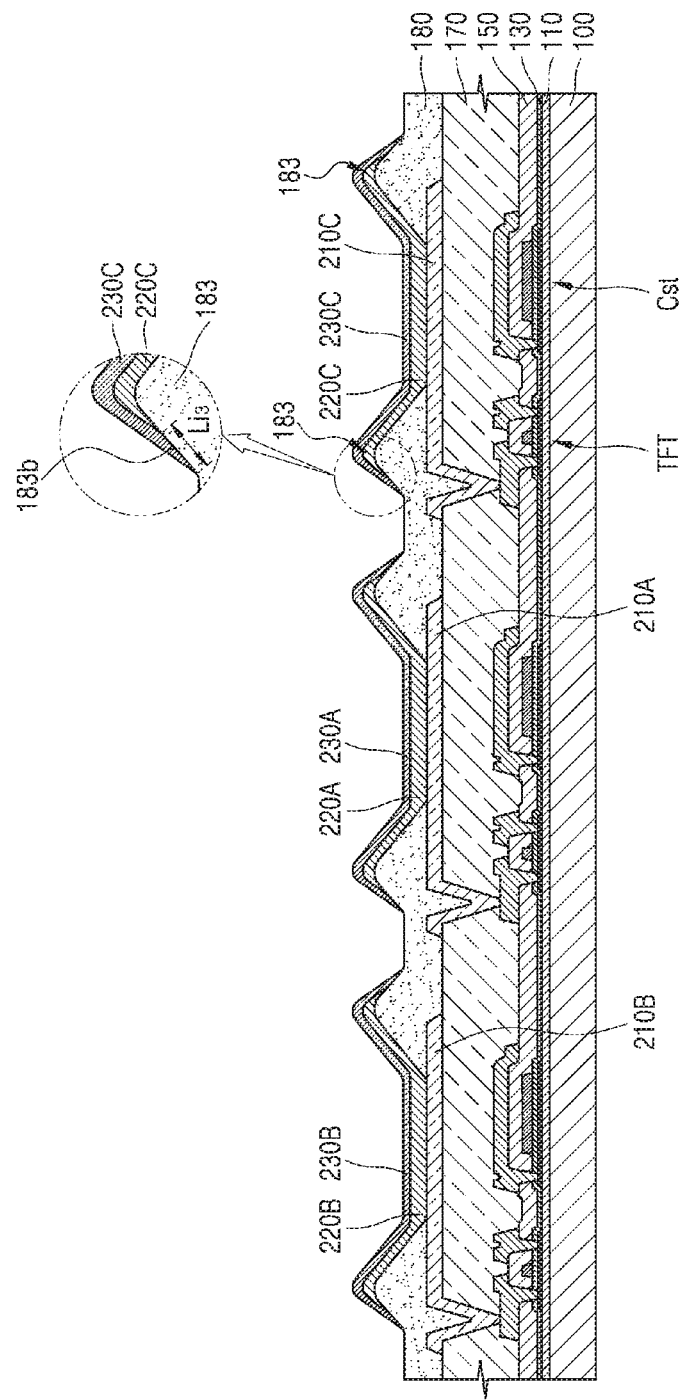

Referring to FIG. 10, the third masking pattern 630 is removed via a lift-off process. For example, when the third protective resin layer 430 (see FIG. 9) is removed by using a fluoric solvent, the third photoresist layer 530, the third intermediate layer 220C, and the third conductive inorganic layer 230C stacked on the third protective resin layer 430 may also be removed.

The third intermediate layer 220C and the third conductive inorganic layer 230C may remain on the third pixel electrode 210C, and the third intermediate layer 220C may be entirely covered with the third conductive inorganic layer 230C. The end of the third conductive inorganic layer 230C may extend over the second lateral surface 183b of the third convex portion 183 of the pixel defining layer 180 beyond the end of the third intermediate layer 220C and may directly contact the second lateral surface 183b. A length $Li_3$ corresponding to a distance between the end of the third conductive inorganic layer 230C and the end of the third intermediate layer 220C may be about 0.5 µm or greater. Since the end of the third conductive inorganic layer 230C extends beyond the end of the third intermediate layer 220C by about 0.5 µm or greater, the third intermediate layer 220C may be entirely covered and protected, adhesion of the third conductive inorganic layer 230C with the pixel defining layer 180 may be sufficiently secured, and it is possible to prevent the end of the third conductive inorganic layer 230C from peeling off from the pixel defining layer 180 due to a stress of the third conductive inorganic layer 230C itself.

Via the process of FIGS. 9 and 10 of patterning the third intermediate layer 220C and the third conductive inorganic layer 230C by using the third masking pattern 630, ends of the third intermediate layer 220C and the third conductive inorganic layer 230C on the third pixel electrode 210C, particularly, an end of the third conductive inorganic layer 230C, may be located on the mound of the pixel defining layer 180 between the third pixel electrode 210C and a pixel electrode adjacent to the third pixel electrode 210C. For example, the end of the third conductive inorganic layer 230C may be located on the mound of the pixel defining layer 180 between the third opening OP3 and the first opening OP1 or the mound of the pixel defining layer 180 between the third opening OP3 and the second opening OP2. In more detail, the end of the third conductive inorganic layer 230C may be located between the third convex portion 183 and the first convex portion 181 or/and between the third convex portion 183 and the second convex portion 182.

Figure 11:
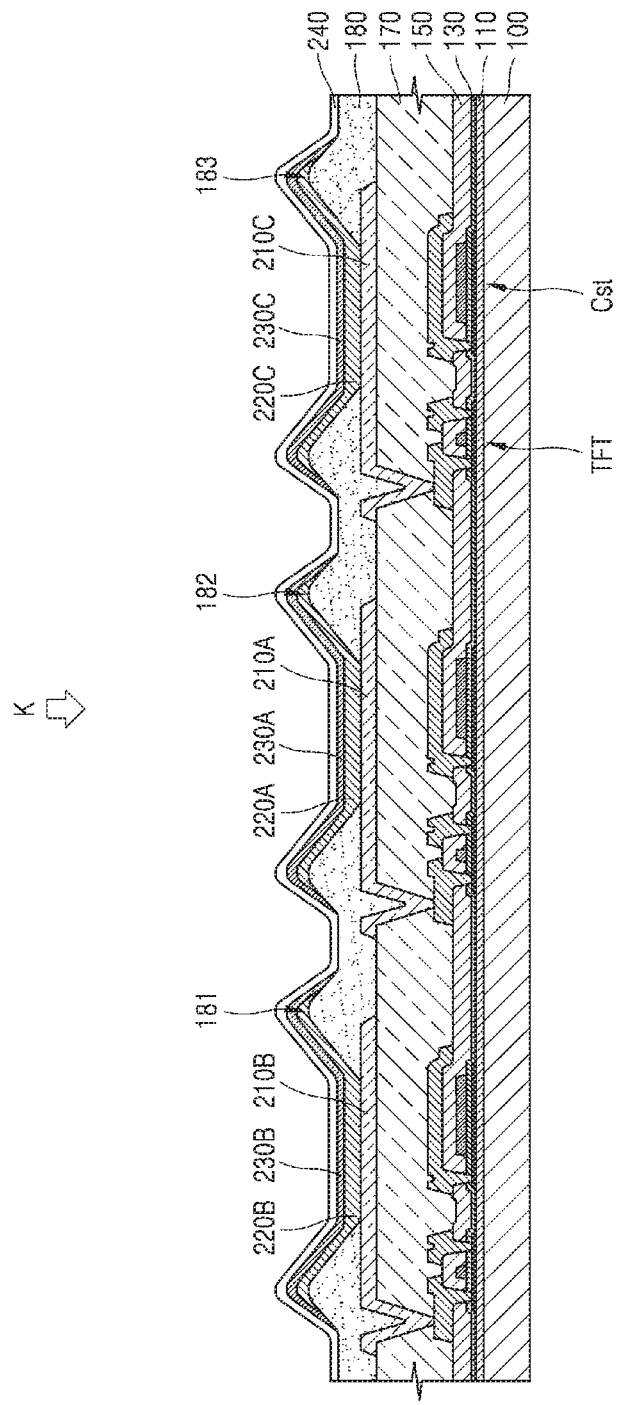

Referring to FIG. 11, a common opposite electrode 240 may be formed on the substrate 100. The common opposite electrode 240 may be a layer formed of Ag, Mg, Al, Yb, Ca, Li, Au, or a compound thereof, or a layer formed of a transparent material, such as ITO, IZO, ZnO, or $In_2O_3$. Alternatively, the common opposite electrode 240 may include a metal thin film including Ag and Mg. For example, the common opposite electrode 240 may be a layer including at least one material selected from among Li, Ca, LiF/Ca, LiF/Al, Al, Ag, and Mg.

Figure 14A:
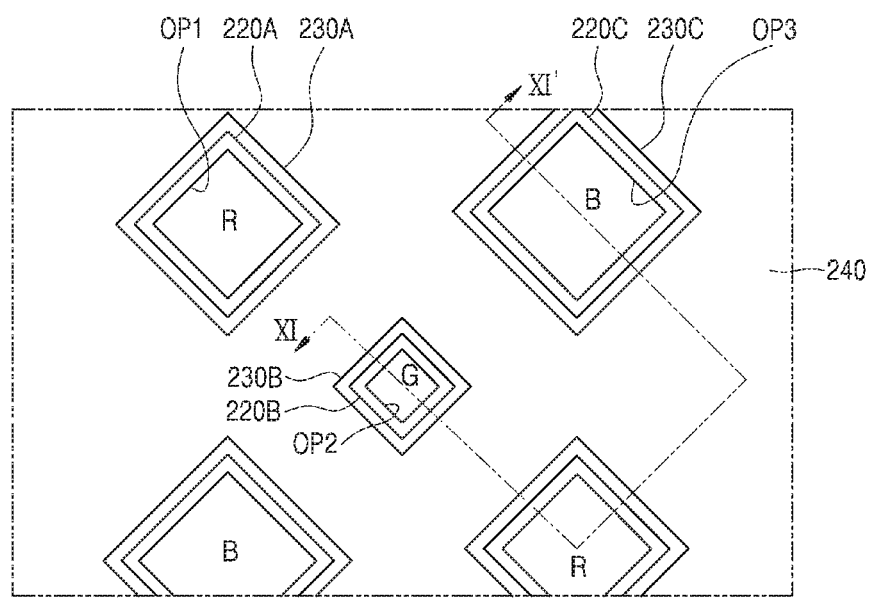
FIG. 14A is a plan view of a display device according to an exemplary embodiment of the inventive concepts.
Figure 14B:
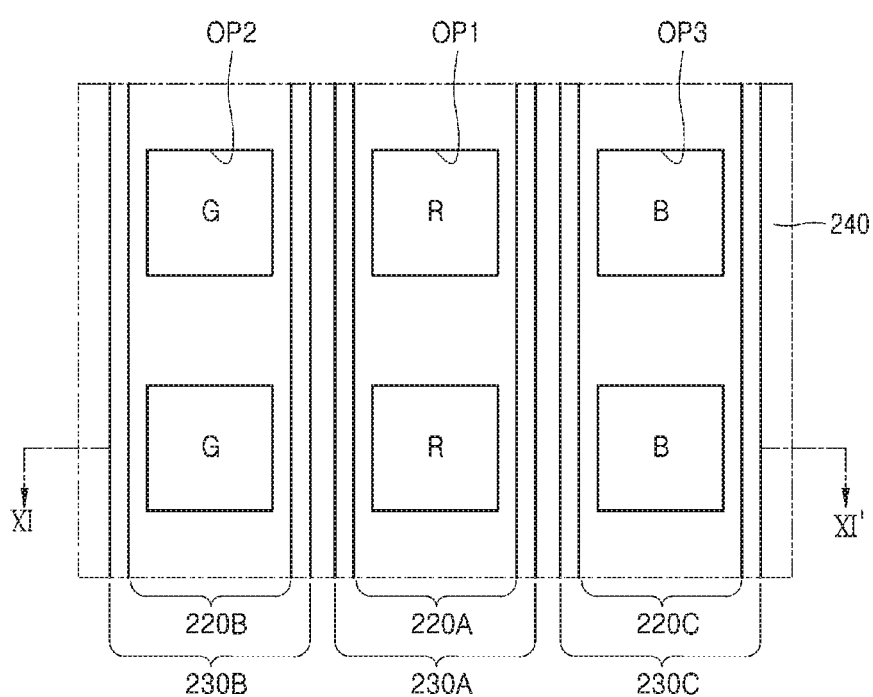
FIG. 14B is a plan view of a portion of a display device according to another an exemplary embodiment of the inventive concepts.

FIG. 14A is a plan view of a portion of a display device according to an exemplary embodiment of the inventive concepts. FIG. 14B is a plan view of a portion of a display device according to another exemplary embodiment of the inventive concepts. FIGS. 14A and 14B may correspond to plan views as viewed in a direction K of FIG. 11. FIG. 11 may correspond to a cross-section taken along line XI-XI' of FIGS. 14A and 14B.

Referring to FIGS. 14A and 14B, pixels R, G, and B may be arranged to be spaced apart from each other. According to layouts of the pixels R, G, and B, the first, second, and third intermediate layers 220A, 220B, and 220C and the first, second, and third conductive inorganic layers 230A, 230B, and 230C may be individually/independently patterned for each of the pixels R, G, and B, or may be connected to each other between pixels of the same color.

As shown in FIG. 14A, the first intermediate layer 220A and the first conductive inorganic layer 230A may be independently patterned for each red pixel R, the second intermediate layer 220B and the second conductive inorganic layer 230B may be independently patterned for each green pixel G, and the third intermediate layer 220C and the third conductive inorganic layer 230C may be independently patterned for each blue pixel B.

As described above, respective first ends of the first, second, and third conductive inorganic layers 230A, 230B, and 230C may extend over the pixel defining layer 180 beyond respective first ends of the first, second, and third intermediate layers 220A, 220B, and 220C as shown in FIG. 11, and may contact the pixel defining layer 180. Although the first convex portion 181 (see FIG. 11) of the pixel defining layer 180 is not shown in FIG. 14A, the first convex portion 181 may be formed to entirely surround the first opening OP1. Similarly, the second convex portion 182 (see FIG. 11) may be formed to entirely surround the second opening OP2, and the third convex portion 183 (see FIG. 11) may be formed to entirely surround the third opening OP3.

As shown in FIG. 14A, the first, second, and third conductive inorganic layers 230A, 230B, and 230C spaced apart from each other may be covered with the common opposite electrode 240 described above with reference to FIG. 11, and may be electrically connected to each other by the common opposite electrode 240.

Referring to FIG. 14B, first intermediate layers 220A may be integrally patterned on the red pixels R, and first conductive inorganic layers 230A may be integrally patterned on the red pixels R. For example, the first intermediate layers 220A may be patterned to form a stripe over a plurality of red pixels R, and the first conductive inorganic layers 230A may be patterned to form a stripe over the plurality of red pixels R. Similarly, the second intermediate layers 220B may be patterned to form a stripe over a plurality of green pixels G, and the second conductive inorganic layers 230B may be patterned to form a stripe over the plurality of green pixels R, and the third intermediate layers 220C may be patterned to form a stripe over a plurality of blue pixels B, and the third conductive inorganic layers 230C may be patterned to form a stripe over the plurality of blue pixels B.

As described above, respective one ends of the first, second, and third conductive inorganic layers 230A, 230B, and 230C may extend over the pixel defining layer 180 beyond respective one ends of the first, second, and third intermediate layers 220A, 220B, and 220C as shown in FIG. 11, and may contact the pixel defining layer 180. Although the first convex portion 181 (see FIG. 11) of the pixel defining layer 180 is not shown in FIG. 14B, the first convex portion 181 may be formed to partially surround the first opening OP1, for example, may be vertically formed along both side walls of the first opening OP1 in FIG. 14B. Similarly, the second convex portion 182 (see FIG. 11) may be formed along both side walls of the second opening OP2, and the third convex portion 183 (see FIG. 11) may be formed along both side walls of the third opening OP3.

According to an exemplary embodiment, the first, second, and third conductive inorganic layers 230A, 230B, and 230C may be covered with the common opposite electrode 240 described above with reference to FIG. 11, and may be electrically connected to each other by the common opposite electrode 240.

Figure 15:
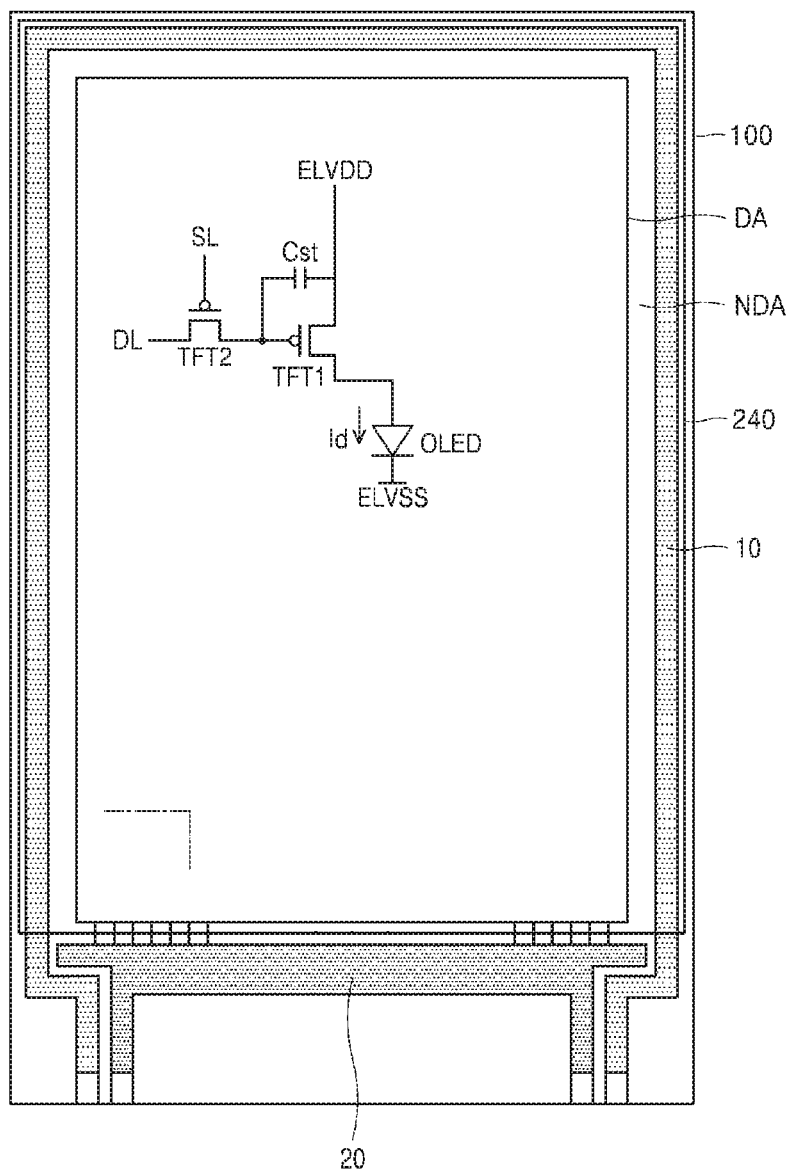
FIG. 15 is a schematic plan view of a display device according to an exemplary embodiment of the inventive concepts.

FIG. 15 is a schematic plan view of a display device according to an exemplary embodiment.

Referring to FIG. 15, the common opposite electrode 240 described above with reference to FIGS. 11, 14A, and 14B may cover a display region DA, and may contact a first electrode power supply line 10 included in a non-display region NDA, which is an edge region of the substrate 100. The first electrode power supply line 10 supplies a first power supply voltage ELVSS to each pixel (sub pixel) via the common opposite electrode 240. A second power supply line 20 may be arranged on the non-display region NDA of the substrate 100, and the second power supply line 20 supplies a second power supply voltage ELVDD to each pixel (sub pixel) via lines.

A switching thin film transistor TFT2 of each sub pixel transmits a data voltage received from a data line DL to a driving thin film transistor TFT1 according to a switching voltage received from a scan line SL. A storage capacitor Cst may store a voltage corresponding to a difference between a voltage received from the switching thin film transistor TFT2 and the second power supply voltage ELVDD, and the driving thin film transistor TFT1 may control a driving current Id of an organic light-emitting device OLED in accordance with a value of the voltage stored in the storage capacitor Cst. The organic light-emitting device OLED may emit light having a certain brightness by the driving current Id.

Although FIGS. 11, 14A, 14B, and 15 illustrate a case where the first, second, and third conductive inorganic layers 230A, 230B, and 230C receive the first power supply voltage ELVSS by the common opposite electrode 240 and are electrically connected to each other, exemplary embodiments are not limited thereto.

According to another exemplary embodiment, when each of the first, second, and third conductive inorganic layers 230A, 230B, and 230C extends to form a stripe as shown in FIG. 14B, each of the first, second, and third conductive inorganic layers 230A, 230B, and 230C may extend to directly contact the first electrode power supply line 10 included in the non-display region NDA of FIG. 15 of the substrate 100. In this case, the first, second, and third conductive inorganic layers 230A, 230B, and 230C may receive the first power supply voltage ELVSS even when the first, second, and third conductive inorganic layers 230A, 230B, and 230C are not covered with the common opposite electrode 240.

Figure 16:
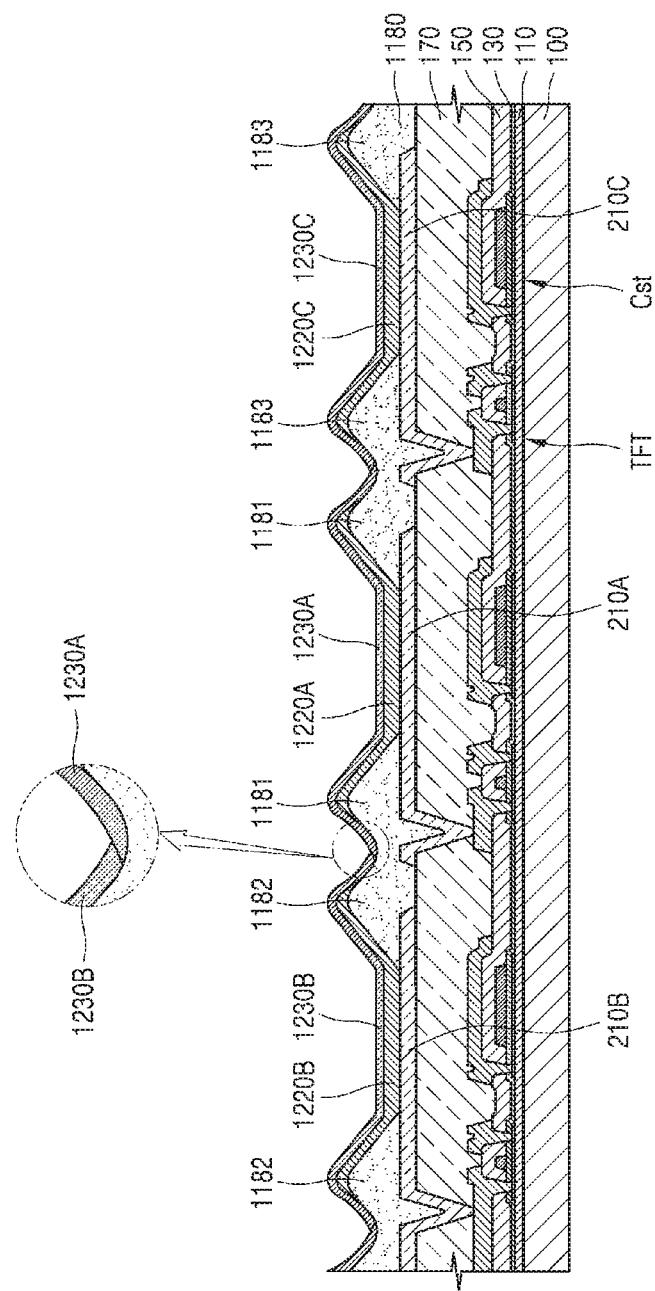
FIG. 16 is a schematic cross-sectional view of a display device according to another exemplary embodiment of the inventive concepts.

FIG. 16 is a schematic cross-sectional view of a display device according to another exemplary embodiment of the inventive concepts.

As resolution of the display device increases, an interval between adjacent sub pixels may become smaller. In this case, as shown in FIG. 16, a width of a mound of a pixel defining layer 1180 between adjacent pixel electrodes, for example, the first and second pixel electrodes 210A and 210B, may decrease, and, as the width of the mound decreases, a width of a concave portion between first and second convex portions 1181 and 1182 may also decrease.

Although a process of forming first, second, and third intermediate layers 1220A, 1220B, and 1220C and first, second, and third conductive inorganic layers 1230A, 1230B, and 1230C on the first, second, and third pixel electrodes 210A, 210B, and 210C may be the same as the process described above with reference to FIGS. 1-10, when the width of the mound of the pixel defining layer 1180 decreases or/and an incidence angle or the like of a conductive inorganic material changes, adjacent conductive inorganic layers may contact each other, as shown in FIG. 16. For example, an end of the first conductive inorganic layer 1230A and an end of the second conductive inorganic layer 1230B may overlap with each other and contact each other between the first and second convex portions 1181 and 1182, for example, on a concave portion between the first and second convex portions 1181 and 1182. Similarly, the end of the second conductive inorganic layer 1230B and an end of the third conductive inorganic layer 1230C may overlap and contact each other on a concave portion between the second convex portions 1182 and a third convex portion 1183, and the end of the third conductive inorganic layer 1230C and the end of the first conductive inorganic layer 1230A may overlap and contact each other on a concave portion between the first and third convex portions 1182 and 1183.

Each of the first, second, and third conductive inorganic layers 1230A, 1230B, and 1230C may extend to directly contact the first electrode power supply line 10 included in the non-display region NDA of FIG. 15 of the substrate 100, and may directly receive the first power supply voltage ELVSS. Alternatively, the first, second, and third conductive inorganic layers 1230A, 1230B, and 1230C may receive the first power supply voltage ELVSS via the common opposite electrode 240 of FIG. 15.

Figure 17:
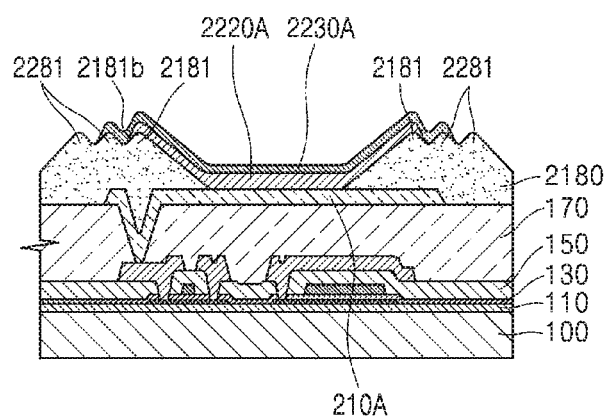
FIG. 17 is a cross-sectional view of a portion of a display device according to another exemplary embodiment of the inventive concepts.
Figure 18:
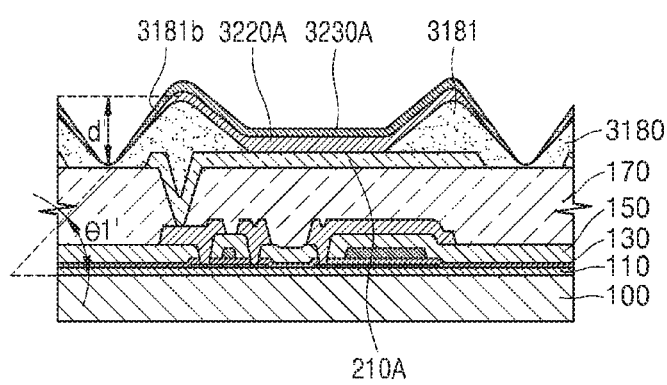
FIG. 18 is a cross-sectional view of a portion of a display device according to another exemplary embodiment of the inventive concepts.

FIGS. 17 and 18 are cross-sectional views of portions of display devices according to other exemplary embodiments of the inventive concepts.

Referring to FIG. 17, at least one additional protrusion 2281 may be further disposed around a first convex portion 2181 of a pixel defining layer 2180 that at least partially surrounds the first pixel electrode 210A.

An end of a first conductive inorganic layer 2230A extending beyond an end of a first intermediate layer 2220A may extend over a peak of the first convex portion 2181 and a second lateral surface 2181*b* of the first convex portion 2181, and at this time, may also extend over a peak of one additional protrusion 2281.

Referring to FIG. 18, a depth d' of a concave portion of a pixel defining layer 3180 that at least partially surrounds the first pixel electrode 210A, the concave portion adjacent to a first convex portion 3181 of the pixel defining layer 3180, may be smaller than or substantially the same as a height of the first convex portion 3181.

An end of a first conductive inorganic layer 3230A may extend beyond an end of a first intermediate layer 3220A, and, at this time, may extend over a peak of the first convex portion 3181 and a second lateral surface 3181*b* of the first convex portion 3181. As described above, by changing, for example, the depth d' of the concave portion of the pixel defining layer 3180 and an angle θ1' between the second lateral surface 3181*b* and the main surface of the substrate 100, a contact area between the first conductive inorganic layer 3230A and the pixel defining layer 3180, for example, between the first conductive inorganic layer 3230A and the second lateral surface 3181*b*, may be increased.

Although structures of the pixel defining layers 2180 and 3180 have been described above with reference to FIGS. 17 and 18 by focusing on the first pixel electrode 210A, the second intermediate layers 2220A and 3220A, and the first conductive inorganic layers 2230A and 3230A, these structures may also apply to a structure of a pixel defining layer focused on second and third pixel electrodes, second and third intermediate layers, and second and third conductive inorganic layers.

Although certain exemplary embodiments and implementations have been described herein, other embodiments and modifications will be apparent from this description. Accordingly, the inventive concept is not limited to such embodiments, but rather to the broader is scope of the presented claims and various obvious modifications and equivalent arrangements.

What is claimed is:

1. A display device comprising:
   a first pixel electrode and a second pixel electrode disposed adjacent to each other on a substrate;
   a pixel defining layer including a first opening corresponding to the first pixel electrode, a second opening corresponding to the second pixel electrode, a first convex portion adjacent to the first opening, and a second convex portion adjacent to the second opening;
   a first intermediate layer disposed on the first pixel electrode and arranged to correspond to the first opening and including a first emission layer; and
   a first conductive inorganic layer disposed on the first intermediate layer and arranged to correspond to the first opening,
   wherein at least one end of the first conductive inorganic layer extends beyond an end of the first intermediate layer and is disposed on the pixel defining layer between a peak of the first convex portion and a peak of the second convex portion.

2. The display device of claim 1, wherein the first convex portion comprises a first lateral surface directed toward the first opening and a second lateral surface opposite to the first lateral surface, and the peak of the first convex portion is between the first lateral surface and the second lateral surface.

3. The display device of claim 2, wherein the at least one end of the first conductive inorganic layer extends over the second lateral surface beyond the peak of the first convex portion.

4. The display device of claim 2, wherein an end of the first intermediate layer extends over the second lateral surface beyond the peak of the first convex portion.

5. The display device of claim 2, wherein an angle between the second lateral surface and a main surface of the substrate is less than 90°.

6. The display device of claim 1, wherein the at least one end of the first conductive inorganic layer directly contacts the pixel defining layer.

7. The display device of claim 1, wherein the at least one end of the first conductive inorganic layer extends beyond an end of the first intermediate layer by 0.5 µm or more.

8. The display device of claim 1, wherein the first conductive inorganic layer comprises a metal layer including silver (Ag), magnesium (Mg), aluminum (Al), ytterbium (Yb), calcium (Ca), lithium (Li), gold (Au), or a compound thereof.

9. The display device of claim 1, wherein the first conductive inorganic layer comprises a transparent conductive oxide (TCO).

10. The display device of claim 1, wherein the first intermediate layer further comprises at least one of a first functional layer disposed between the first pixel electrode and the first emission layer and a second functional layer disposed between the first emission layer and the first conductive inorganic layer.

11. A display device comprising:
    a first pixel electrode and a second pixel electrode disposed adjacent to each other;
    a pixel defining layer including a first opening corresponding to the first pixel electrode, a second opening corresponding to the second pixel electrode, a first convex portion adjacent to the first opening, and a second convex portion adjacent to the second opening;
    a first intermediate layer disposed on the first pixel electrode and including a first emission layer;
    a second intermediate layer disposed on the second pixel electrode and including a second emission layer;
    a first conductive inorganic layer disposed on the first intermediate layer and configured to cover an end of the first intermediate layer; and
    a second conductive inorganic layer disposed on the second intermediate layer and configured to cover an end of the second intermediate layer,
    wherein at least one end of the first conductive inorganic layer and at least one end of the second conductive inorganic layer are arranged between a peak of the first convex portion and a peak of the second convex portion.

12. The display device of claim 11, wherein at least one end of the first conductive inorganic layer extends over an end of the first intermediate layer and directly contacts the pixel defining layer.

13. The display device of claim 11, wherein at least one end of the first conductive inorganic layer extends farther toward the second convex portion than an end of the first intermediate layer.

14. The display device of claim 11, wherein:
    the first convex portion comprises a first lateral surface directed toward the first opening and a second lateral surface opposite to the first lateral surface, and a peak of the first convex portion is arranged between the first lateral surface and the second lateral surface; and
    at least one end of the first conductive inorganic layer extends over the second lateral surface beyond the peak of the first convex portion.

15. The display device of claim 11, wherein the pixel definition layer further comprises an additional convex portion arranged between the first convex portion and the second convex portion.

16. The display device of claim 11, further comprising a common opposite electrode disposed on the first conductive inorganic layer and the second conductive inorganic layer and configured to cover the first conductive inorganic layer and the second conductive inorganic layer.

17. The display device of claim 11, wherein at least one of the first conductive inorganic layer and the second conductive inorganic layer comprises at least one of a conductive metal layer and a conductive oxide layer.

18. The display device of claim 17, wherein the conductive metal layer comprises silver (Ag), magnesium (Mg), aluminum (Al), ytterbium (Yb), calcium (Ca), lithium (Li), gold (Au), or a compound thereof.

19. The display device of claim 17, wherein the conductive oxide layer comprises at least one of indium tin oxide (ITO), indium zinc oxide (IZO), zinc oxide (ZnO), indium oxide ($In_2O_3$), indium gallium oxide (IGO), and aluminum zinc oxide (AZO).

* * * * *